United States Patent

Tanaka

[11] Patent Number: 5,841,414
[45] Date of Patent: Nov. 24, 1998

[54] LIQUID CRYSTAL DISPLAY DEVICE

[75] Inventor: Kazuo Tanaka, Tanashi, Japan

[73] Assignee: Citizen Watch Co., Ltd., Tokyo, Japan

[21] Appl. No.: 888,277

[22] Filed: Jul. 3, 1997

Related U.S. Application Data

[63] Continuation-in-part of Ser. No. 291,934, Aug. 16, 1994, Pat. No. 5,654,730.

[51] Int. Cl.$^6$ ..................................................... G09G 3/36
[52] U.S. Cl. ............................................. 345/87; 345/206
[58] Field of Search ............................... 345/87, 98, 205, 345/206; 349/139

[56] References Cited

U.S. PATENT DOCUMENTS

| | | | |
|---|---|---|---|
| 4,862,153 | 8/1989 | Nakatani et al. | 345/98 |
| 5,016,986 | 5/1991 | Kawashima et al. | 359/87 |
| 5,293,261 | 3/1994 | Adachi et al. | 359/88 |

OTHER PUBLICATIONS

NOK Co. Ltd. Catalog, CAT No. 615–10–92–10K, issued Oct. 1992.

*Primary Examiner*—Matthew Luu
*Attorney, Agent, or Firm*—Finnegan, Henderson, Farabow, Garrett & Dunner, L.L.P.

[57] ABSTRACT

A constitution of a liquid crystal display apparatus, which has a reduced total size thereof while maintaining the necessary size of a liquid crystal display panel, is provided.

A liquid crystal display apparatus 1 comprising a liquid crystal display panel 2, a plurality of drive circuit substrates 3, 4-1, 4-2 for the liquid crystal display panel 2 and a control circuit substrate 5, wherein the first drive circuit substrate 3 as at least a part of said drive circuit substrate 1 is connected to the liquid crystal display panel 2 via a flexible connection wiring portion 30, second drive circuit substrates 4-1, 4-2, as the remaining drive circuit substrate are connected fixedly to the liquid crystal display panel 2, the second drive circuit substrates 4-1, 4-2 being provided with flexible connection wiring portions 61, 62, one end portion E of each of the flexible connection wiring portions 61, 62 are provided with connector inserting means 63, 64, and the control circuit substrate 5 is provided with input/output connector means 51, 52 which are engaged with the connector inserting means 63, 64 for connection purposes.

14 Claims, 19 Drawing Sheets

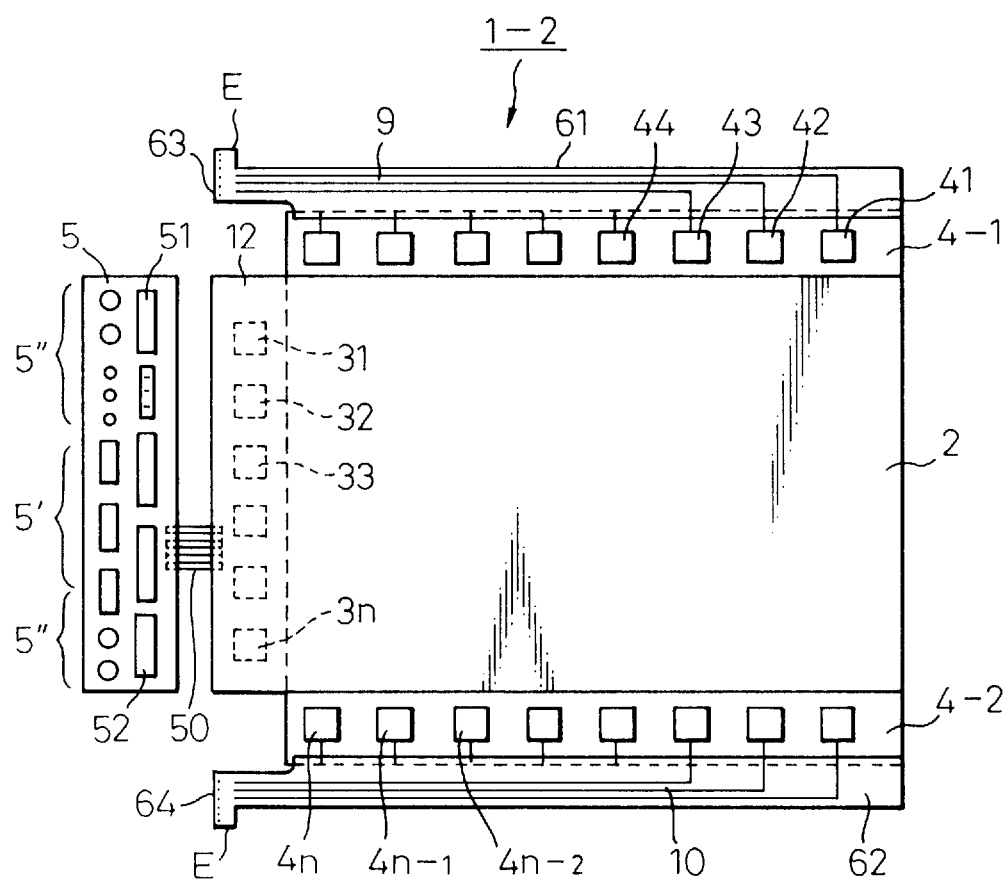

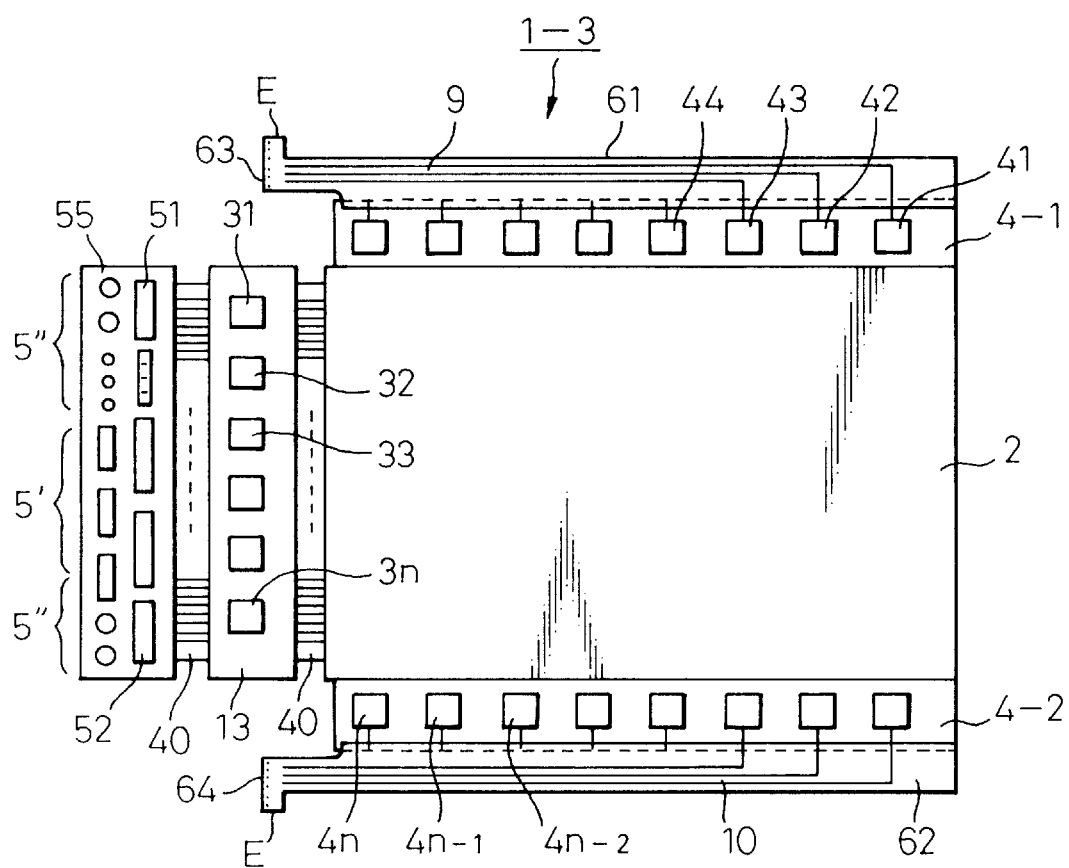

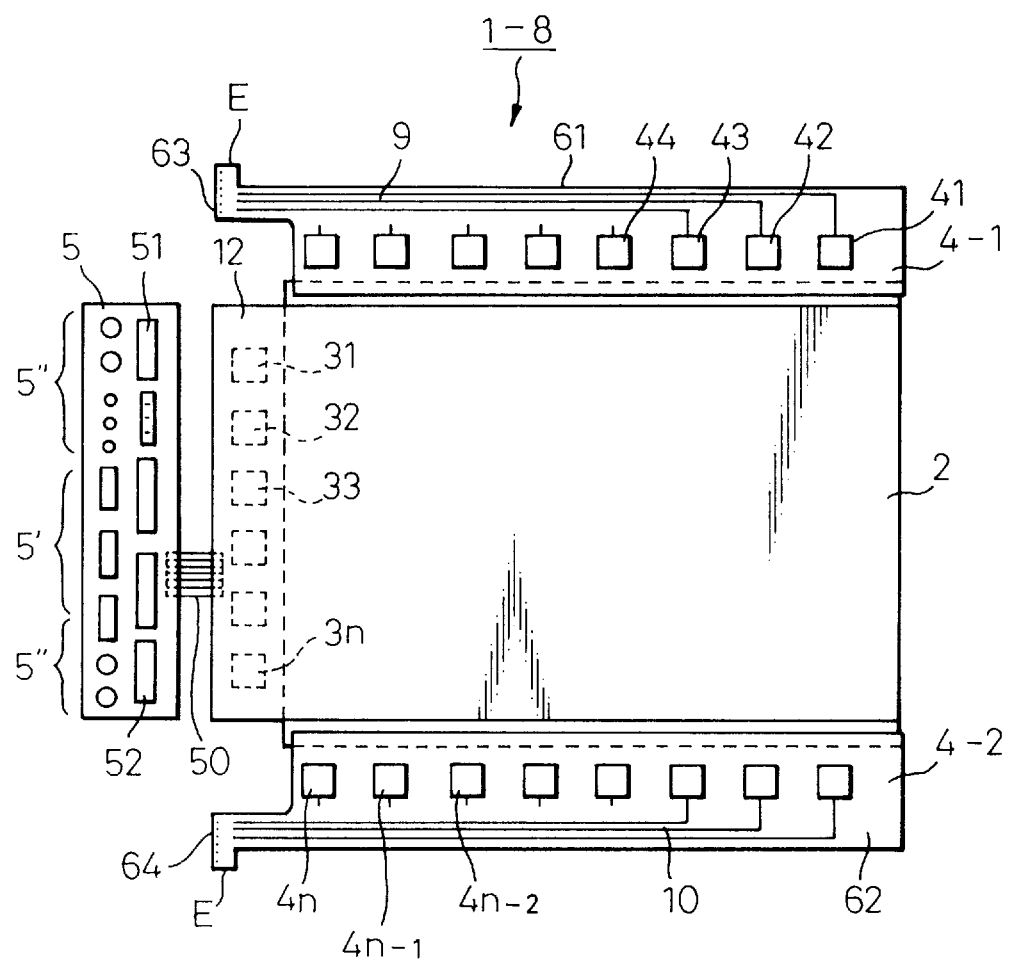

LIQUID CRYSTAL DISPLAY DEVICE

CROSS REFERENCE TO RELATED APPLICATION

This application is a continuation-in-part application of Ser. No. 08/291,934 filed on Aug. 16, 1994, now a U.S. Pat. No. 5,654,730.

BACKGROUND OF THE INVENTION

1. Field of the Invention

The present invention relates to a liquid crystal display apparatus and, more specifically, to a liquid crystal display apparatus which allows the total size of a liquid crystal display apparatus to be reduced by reducing the area occupied by the drive control system provided at the periphery of a liquid crystal display panel.

2. Description of the Related Art

As a standard constitution of a liquid crystal display apparatus, as shown in FIG. 4, a liquid crystal display panel 2 is provided, and one side 21 of such liquid crystal display panel 2 is provided with a common electrode drive circuit substrate 3 comprising a plurality of drive circuits $IC_{31}$ to $IC_{3n}$ for driving and controlling common electrodes (Y electrodes) to control scanning and timing of an image, while a pair of sides 22, 23 of the liquid crystal display panel 2 are provided with segment electrode drive circuit substrates 4-1, 4-2 comprising a plurality of drive circuits $IC_{41}$ to $IC_{4n}$ for driving and controlling segment electrodes (X electrodes) for inputting image information.

Moreover, in the liquid crystal display apparatus described above, a control circuit substrate 5 comprising an LSI or the like for individually driving and controlling drive circuits $IC_{31}$ to $IC_{3n}$ and $IC_{41}$ to $IC_{4n}$ provided on the common electrode drive circuit substrate 3 and segment electrode drive circuit substrates 4-1, 4-2, an input/output means 6 and a peripheral circuit substrate 8 composed of a central arithmetic means 7 or the like formed of a microcomputer or the like for controlling the control circuit substrate 5 are provided.

In such a liquid crystal display apparatus 1 of the prior art, the common electrode drive circuit substrate 3 and segment electrode drive circuit substrates 4-1, 4-2 described above are in general fixed integrally and fixedly to side edges of the liquid crystal display panel 2 and the drive circuits $IC_{31}$ to $IC_{3n}$ and $IC_{41}$ to $IC_{4n}$ provided on the common electrode drive circuit substrate 3 and segment electrode drive circuit substrates 4-1, 4-2 are connected with predetermined input/output terminals of the control circuit substrate 5 via adequate wiring 9, 10, 11 or the like.

Therefore, since the respective sizes of the common electrode drive circuit substrate 3 and segment electrode drive circuit substrates 4-1, 4-2 are added to the size of the relevant liquid crystal display panel 2 in the liquid crystal display apparatus 1 of the prior art, the total size of the liquid crystal display apparatus 1 is inevitably increased to a size considerably larger than the relevant liquid crystal display panel 2. Accordingly, if it was required to reduce the total size of the relevant liquid crystal display apparatus 1, it was achieved at the cost of reducing the size of the liquid crystal display panel 2 itself.

Moreover, as illustrated in FIG. 4, when the drive circuits are mounted directly on a liquid crystal display panel for driving the common electrodes and segment electrodes, the liquid crystal display panel 2, for example, contains a liquid crystal material that is held or inserted between at least two sheets of transparent glass substrates or plastic substrates and the periphery of the liquid crystal is hermetically sealed with a sealing material. In the above-mentioned case of the so-called COG (Chip On Glass) constitution, the drive circuits $IC_{41}$ to $IC_{4n}$ are directly mounted on and held by the substrate glass in the face-down mounting basis, at almost the edge portion of the substrate and at the external side of the sealing material of substrate. Therefore the control circuit substrate 5 and the liquid crystal display panel 2 are connected to each other as illustrated in FIG. 4 and therefore the input/output terminals are arranged so as to be concentrated at end side surfaces of the liquid crystal display panel 2 and of the control circuit substrate 5, each opposing each other.

Therefore, the gaps between the adjacent input/output terminals must be narrow or the electrodes must be thin, resulting in problems that the electrodes are short-circuited, broken or have a high resistance.

Further, in the prior art in which a liquid crystal display apparatus is produced in such a way that the control circuit substrate is first constituted together with the common electrode drive circuit and then the combined substrates are connected to the liquid crystal display via a flexible connection wiring portion, another problem arises in that some differences are generated between the yield in mounting the drive circuits on a substrate for control circuits and that for the common electrode drive circuit, therefore the yield of the liquid crystal display panel is necessarily determined by one of the above-mentioned yields, whichever is worse. Thus, this fact causes an increase in the manufacturing cost of the liquid crystal display apparatus.

SUMMARY OF THE INVENTION

It is therefore an object of the present invention to provide a liquid crystal display apparatus which has advantages over the prior art and can reduce the total size of the apparatus while maintaining the necessary size of the liquid crystal display panel. The present invention also provides a liquid crystal display apparatus which overcomes the problems such as an increase in short-circuits between adjacent input/output terminals, the breaking of wires, or an increase in electrode resistance and, moreover, is cheaper to manufacture and has a better yield in mounting ICs on the substrate.

In view of achieving the object described above, the present invention basically employs a technology and a constitution that will be explained hereunder. That is, the present invention proposes a liquid crystal display apparatus 1 comprising a liquid crystal display panel 2, a drive circuit substrate 3, 4-1, 4-2 including a panel drive IC groups 31-3n, 41-4n, arranged in the periphery of the liquid crystal display panel 2 to drive this panel and a control circuit substrate 5 connected to the drive circuit substrate for individually driving and controlling the panel drive ICs of the drive circuit substrate, in which a first drive circuit substrate 3 which is at least a partial drive circuit substrate is connected to the liquid crystal display panel 2 via a first flexible connection wiring portion 30 and a second drive circuit substrate 4-1, 4-2 as the remaining drive circuit substrate, is connected fixedly to the liquid crystal display panel, whereby the second drive circuit substrate is connected to a second flexible connection wiring portion 61, 62 which is connected to input terminals of panel drive ICs provided on the second drive circuit substrate 4-1, 4-2 for supplying thereto a control signal to individually drive and control the relevant panel drive ICs, one end of the second flexible connection wiring portion 61, 62 is provided with a connector insertion means 63, 64, the control circuit substrate 5 is provided with a connector means 51, 52 for outputting a control signal to individually drive and control the panel drive ICs 41-4n provided on the second drive circuit substrate 4-1, 4-2, and the connector means 51, 52 and connector insertion means 63, 64 are constituted to establish engagement therebetween for the connection purpose.

In the above-mentioned embodiment of the present invention, it is explained that the second substrates 4-1, 4-2 are separately formed from the liquid crystal display panel 2 and the second substrates 4-1, 4-2 are connected integrally to the display panel 2.

However, the present invention is not restricted only to the above-mentioned embodiment and the following embodiment is also included into the present invention.

Namely, the second substrates 4-1, 4-2 are not separately fabricated from the display panel 2, previously but the drive circuits 41 to 4n can be mounted on ends portion of the glass substrate forming a part of the display panel 2.

In this embodiment, the second drive circuit substrate is previously fabricated on the display panel 2.

Moreover, in the liquid crystal display apparatus 1 of the present invention, with the basic constitution described above, the first drive circuit substrate 3 connected to the liquid crystal display panel 2 via the first flexible connection wiring portion 30, or both the first drive circuit substrate 3 and the control circuit substrate 5 for controlling drive of the first drive circuit substrate 3 are arranged in such a manner that they can be folded to the lower side of the rear surface of the liquid crystal display panel 2.

The liquid crystal display apparatus 1 of the present invention realizes, through employment of the basic technique and constitution described above, an arrangement where the drive circuit substrate is folded into the position below the rear surface of the liquid crystal display panel 2. Thereby, the region occupied by at least a part of the drive circuit substrate arranged in the periphery of the liquid crystal display panel of the liquid crystal display apparatus can be eliminated and the peripheral circuit area of the liquid crystal display panel can be reduced in size. As a result, a total size of the liquid crystal display apparatus can be reduced, while maintaining the necessary size of the liquid crystal display panel.

Furthermore, in the liquid crystal display apparatus 1 of the present invention, a part of the drive circuit substrate 4-1, 4-2 connected directly to the liquid crystal display panel 2 is connected with a second flexible connection wiring portion 61, 62 including a connection wiring for supplying a control signal to individually drive and control the panel drive ICs 41-4n, one end portion of the second flexible connection wiring portion 61, 62, that is, an end portion thereof near the control circuit substrate 5, is provided with a connector insertion means 63, 64 in which the end portions of respective wiring portions 63, 64 are concentrated, the control circuit substrate 5 is provided with a connector means 51, 52 for outputting a control signal to individually drive and control the panel drive ICs 41-4n provided on the second drive circuit substrate 4-1, 4-2, and the connector means 51, 52 and connector insertion means 63, 64 are constituted to establish engagement therebetween for the connection.

As described, since the control circuit substrate 5 is so constituted that the connector insertion means 63, 64 can be easily inserted into the connector means 51, 52, even when the substrate 5 is arranged at the portion below the rear surface of the liquid crystal display panel 2, by suitably curving or folding the flexible connection wiring portion 61, 62, the assembly operation can be realized easily and working efficiency can also be improved remarkably, providing the possibility of manufacturing a small size liquid crystal display panel comprising a stable and reliable connecting portion.

BRIEF DESCRIPTION OF THE DRAWINGS

The present invention will be more clearly understood from the description as set forth below with reference to the accompanying drawings, wherein:

FIG. 5A is a top view illustrating a constitution of a second embodiment of a liquid crystal display apparatus of the present invention;

FIG. 9 is a top view illustrating a constitution of a third embodiment of a liquid crystal display apparatus of the present invention;

FIG. 19 is a top view illustrating a constitution of the eighth embodiment of the present invention.

DESCRIPTION OF THE PREFERRED EMBODIMENT

A preferred embodiment of a liquid crystal display apparatus of the present invention will be explained in detail with reference to the accompanying drawings.

Figure 1:
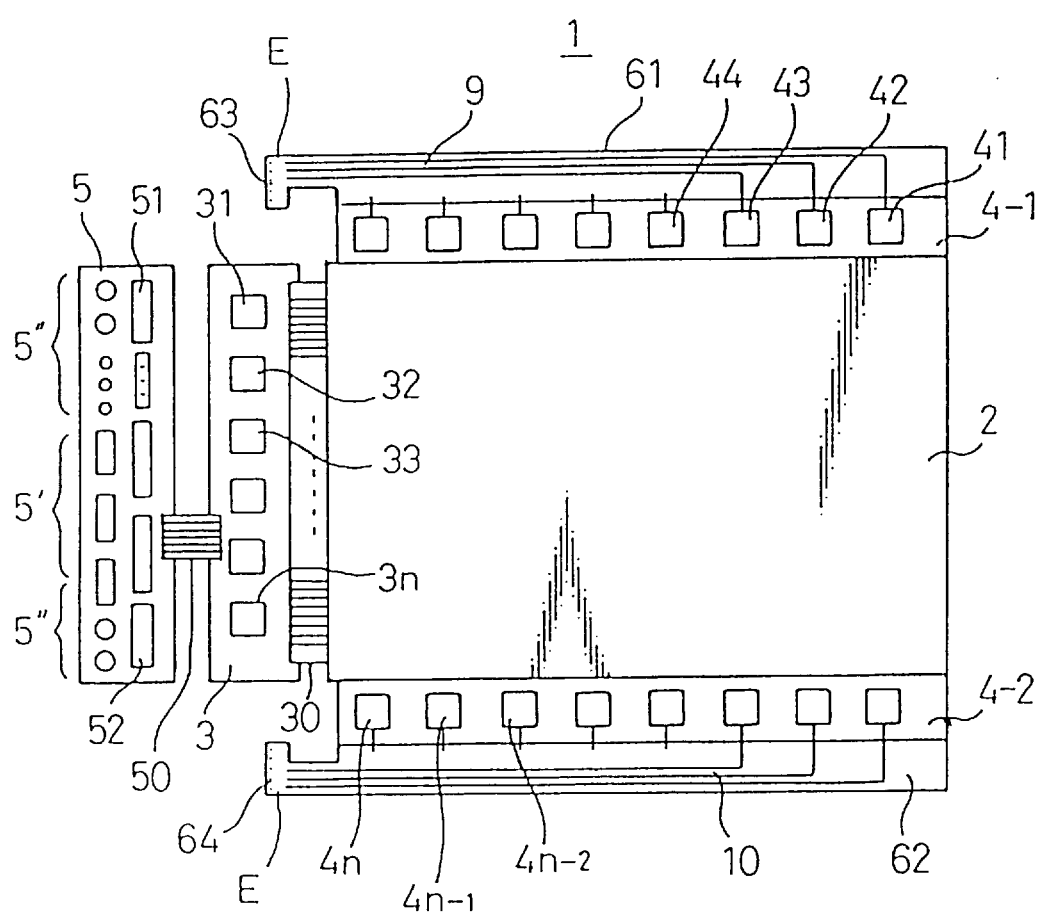
FIG. 1 is a top view illustrating a constitution of a first embodiment of a liquid crystal display apparatus of the present invention.

Namely, FIG. 1 is a top view illustrating a constitution of a first embodiment of a liquid crystal display apparatus of the present invention.

As shown in this figure, the liquid crystal display apparatus 1 comprises a liquid crystal display panel 2, drive circuit substrates 3, 4-1, 4-2 including panel drive circuits $IC_{31}$ to $IC_{3n}$ and $IC_{41}$ to $IC_{4n}$ which are arranged in the periphery of the liquid crystal display panel 2 to drive this panel and a control circuit substrate 5 which is connected to the drive circuit substrates 3, 4-1, 4-2 to individually drive and control the panel drive circuits $IC_{31}$ to $IC_{3n}$ and $IC_{41}$ to $IC_{4n}$, wherein a first drive circuit substrate 3 as at least a part of the drive circuit substrate is connected to the liquid crystal display panel 2 via a first flexible connection wiring portion 30 and second drive circuit substrates 4-1, 4-2 as the remaining drive circuit substrates are fixedly connected to or directly mounted on the liquid crystal display panel 2. Moreover, to the second drive circuit substrates 4-1, 4-2, a second flexible connection wiring portions 61, 62 including the connection wiring 9, 10 connected to the panel drive circuits $IC_{41}$-$IC_{4n}$ provided on the substrate, to supply a control signal to individually drive and control the panel drive circuits $IC_{41}$ to $IC_{4n}$ are connected. On the other hand, one end E of the second flexible connection wiring portions 61, 62 are provided with the connecting insertion means 63, 64, the control circuit substrate 5 is provided with the input/output connector means 51, 52 for outputting a control signal to individually drive and control the panel drive circuits $IC_{41}$ to $IC_{4n}$ provided on the second drive circuit substrates 4-1, 4-2, and these connector means 51, 52 and connector insertion means 63, 64 are constituted to establish engagement therebetween for the connection.

In another embodiment of the present invention, the panel drive circuits $IC_{41}$ to $IC_{4n}$ can be mounted on the second flexible connection wiring portion 61, 62 instead of the drive circuits being mounted on the glass substrate.

Since the flexible connection wiring portions 30, 61, 62 are properly used in combination, particularly the free end portions E of the flexible connection wiring portions 61, 62 are provided with the connector inserting means 63, 64 and the connector means 51, 52 for accepting the connector inserting means 63, 64 are arranged on the control circuit substrate, the connecting portion between the connector inserting means 63, 64 and connector means 51, 52 can be compactly arranged on the periphery of the lower part of the liquid crystal display panel 2 by folding, curving and bending as required the flexible connection wiring portions 30, 61, 62. As a result, the total size of the apparatus can be reduced while maintaining the size of the image display area of the liquid crystal display panel 2.

Namely, in the liquid crystal display apparatus 1 illustrated in FIG. 1, as an example, the common electrode drive circuit substrate 3 providing a plurality of drive circuits $IC_{31}$ to $IC_{3n}$ to drive and control the common electrodes (Y electrodes) is connected to the liquid crystal display panel 2 via the flexible connection wiring portion 30, as the first drive circuit substrate 3 particularly for scanning an image and controlling the timing among the first drive circuit substrate 3 and the second drive circuit substrates 4-1, 4-2 connected to the liquid crystal display panel 2 and the common electrode drive circuit substrate 3 as the first drive circuit substrate can be constituted so that it can be folded, curved and bent for the liquid crystal display panel 2.

That is, respective output terminals of a plurality of drive circuits $IC_{31}$ to $IC_{3n}$ provided on the common electrode drive circuit substrate 3 are connected to wiring printed on the first flexible connection wiring portion 30 and thus the output terminals of each one of the drive circuits $IC_{31}$ to $IC_{3n}$ are connected to respective common electrodes (Y electrodes) of the liquid crystal display panel 2 via the wiring.

The liquid crystal display apparatus 1 of the present invention offers an example, as shown in FIG. 1, where the first drive circuit substrate 3 is flexibly connected to the liquid crystal display panel 2 and the second drive circuit substrates 4-1, 4-2 as the other drive circuit substrate, that is, the second drive circuit substrates 4-1, 4-2 including a plurality of drive circuits $IC_{41}$ to $IC_{4n}$ to drive and control the segment electrodes (X electrodes) are arranged, for example, fixedly or integrally, to the liquid crystal display panel 2. However, the liquid crystal display apparatus 1 of the present invention is not limited only to this example and it is of course possible for the liquid crystal display apparatus of the present invention to have a constitution that the drive circuit substrates 4-1, 4-2 are electrically connected to respective segment electrodes (X electrodes) of the liquid crystal display panel 2 via the wirings printed on the second flexible connection wiring portions 61, 62 and the common electrode drive circuit substrate 3 is fixedly connected to the liquid crystal display panel 2.

Moreover, it is also possible to employ the constitution that a plurality of drive circuits $IC_{41}$ to $IC_{4n}$ to drive and control the segment electrode (X electrodes) are mounted on the second flexible connection wiring portions 61, 62 and all drive circuit substrates 3, 4-1, 4-2 are connected to the liquid crystal display panel via the wirings printed on the flexible connection wiring portions 30, 61, 62.

Here, as the first flexible connection wiring portion 30 used in the present invention to connect between the first drive circuit substrate 3 and the liquid crystal display panel 2, and/or the second flexible connection wiring portions 61, 62 to connect between the second drive circuit substrates 4-1, 4-2 and the control circuit substrate 5, and moreover as a separate flexible connection wiring portion 50, i.e., a third flexible connection wiring portion, to connect between the first drive circuit substrate 3 and control circuit substrate 5, those forming the wiring portion 50 composed of the predetermined number of lines of lead patterns which can be obtained, for example, by etching copper foil on a base film made of polyimide resin can be used.

Figure 2:
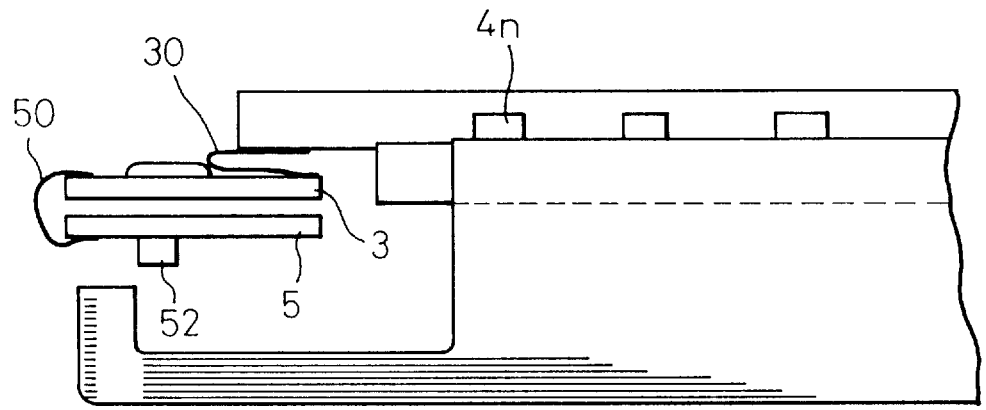
FIG. 2 is a side elevation view illustrating a constitution of the first embodiment of the liquid crystal display apparatus of the present invention.

In the present invention, since the relevant liquid crystal display apparatus 1 has the constitution described heretofore, it is desirable that the drive circuit substrate 3 connected to the liquid crystal display panel 2 via the first flexible connection wiring portion 30 is arranged, as illustrated in FIG. 2, at the lower area of the rear surface of the liquid display panel 2 by folding the flexible connection wiring portion 30 utilizing its flexibility.

The employment of such a constitution has realized the elimination of the space region previously occupied physically by the drive circuit substrate 3 and control circuit substrate 5.

That is, it is thereby possible to arrange the drive circuit substrate 3 and control circuit substrate 5 in the vicinity of a portion of the liquid crystal display panel in which only a connecting portion formed between the liquid crystal display panel 2 and connection wiring portion 30 are provided and the portion thereof is not used for displaying an image.

Furthermore, in another embodiment of the liquid crystal display apparatus 1 of the present invention, it is preferable that among the control circuit substrate 5 including the first drive circuit substrate 3 and the second drive circuit substrates 4-1, 4-2, a control circuit substrate 5 to drive and control, at least the first drive circuit substrate 3 connected to the liquid crystal display panel 2 via the first flexible connection wiring portion 30, that is the common electrodes (Y electrodes) drive circuit substrate 3 is connected to the drive circuit substrate 3 via the separate flexible connection wiring portion 50, i.e., a third flexible connection wiring portion.

As described, in the present invention, it is similarly possible that when a drive control circuit 5' for driving and controlling the first drive circuit substrate 3 and a drive control circuit 5" for driving and controlling the second drive circuit substrates 4-1, 4-2 of the control circuit substrate 5 are formed in different circuit substrates, the first drive circuit substrate 3 and only the drive control circuit 5' for driving and controlling the first drive circuit substrate 3 is connected with the flexible connection wiring portion 50 and moreover, when the drive control circuit 5' for driving and controlling the first drive circuit substrate 3 and the drive control circuit 5" for driving and controlling the second drive circuit substrates 4-1, 4-2 are formed on the same substrate, the control circuit 5 as a whole is connected to the first drive circuit substrate 3 via the third flexible connection wiring portion 50.

In these cases, as described previously, the connecting operation can be performed easily, while the flexible connection wiring portions 30, 50, 61, 62 are being properly bent, curved and folded, by connecting the second drive circuit substrates 4-1 and 4-2 to the drive control circuit 5" for driving and controlling the second drive circuit substrates 4-1, 4-2 via the second flexible connection wiring portions 61, 62 and moreover inserting the connecting inserting means 63, 64 provided at the one end portions of the second flexible connection wiring portions 61, 62 into the connector means 51, 52 provided in the drive control circuit 5" for driving and controlling the second drive circuit substrates 4-1, 4-2 in order to establish the engagement therebetween for the connection purpose.

Therefore, in the embodiments of the present invention described above, as shown in FIG. 2, for example, the drive circuit substrate 3 connected to the liquid crystal display panel 2 via the first flexible connection wiring portion 30 and the control circuit substrate 5 connected to the drive circuit substrate 3 via the third flexible connection wiring portion 50 are arranged at the lower part of the rear surface of the liquid crystal display panel 2 under the condition that these are folded and stacked with each other.

In the other embodiment of the present invention described above, the space region previously occupied by the control circuit substrate 3 and drive circuit substrate 5 can be eliminated and therefore the area of the peripheral control circuit of the liquid crystal display panel 2 in the liquid crystal display apparatus 1 can be reduced remarkably.

On the other hand, connection mainly between the common electrode (Y electrodes) drive circuit substrate 3 and the control circuit substrate 5 in an embodiment of the liquid crystal display apparatus of the present invention has been explained and an example of the connection between the second drive circuit substrates 4-1, 4-2 of the liquid crystal display apparatus 1 of the present invention and the control circuit substrate 5 will be explained with reference to FIG. 1 to FIG. 3.

In the embodiment described above, the second drive circuit substrates 4-1, 4-2 is connected fixedly, as an example, to the liquid crystal display panel 2. In this example, a plurality of drive circuits $IC_{41}$ to $IC_{4n}$ which are provided on the second drive circuit substrates 4-1 and 4-2 to drive and control the segment electrode (X electrodes) are connected respectively, for example, to the wiring portions 9, 10 of the second flexible wiring portions 61, 62 on which the wiring portions formed of the predetermined number of lines of lead patterns obtained by etching copper foil to a base film made of polyimide resin.

This connecting method in this constitution may be replaced with a method using an anisotropic conductive bonding agent made by mixing conductive particles into a resin bonding agent or a method using solder.

On the other hand, the connector inserting means 63, 64 are individually formed at one end portion of each of the second flexible wiring portions 61, 62 and these connector inserting means 63, 64 can individually be engaged with input or output connector means 51, 52 for the control circuits of the second drive circuit substrates 4-1 and 4-2.

Figure 3:
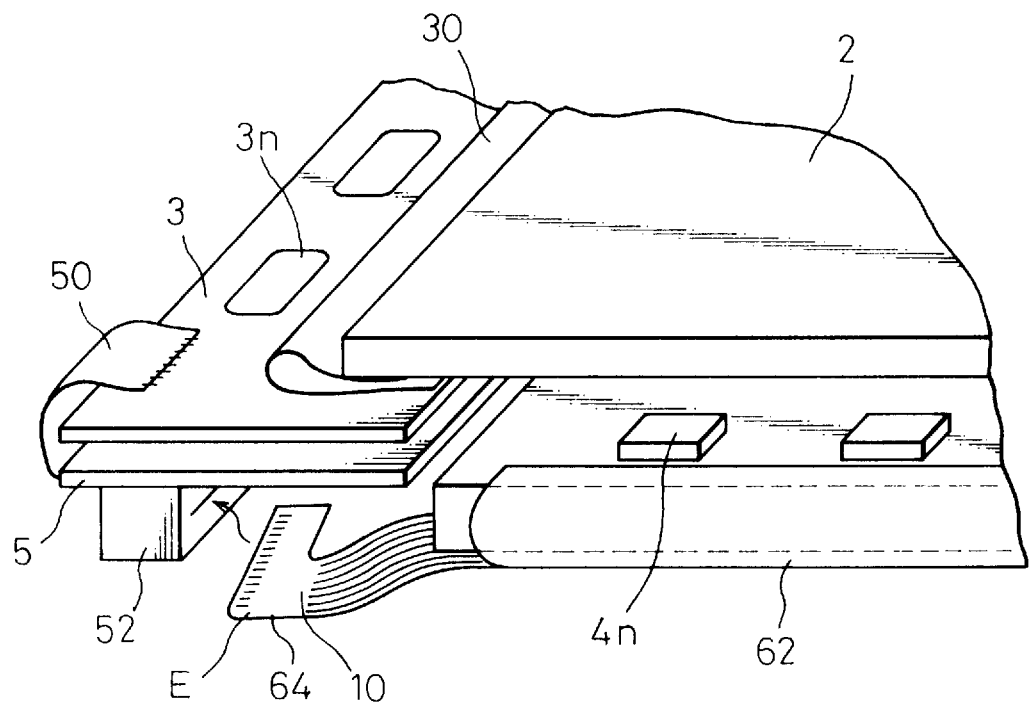
FIG. 3 is a perspective view illustrating a constitution of the first embodiment of the liquid crystal display apparatus of the present invention.
Figure 4:
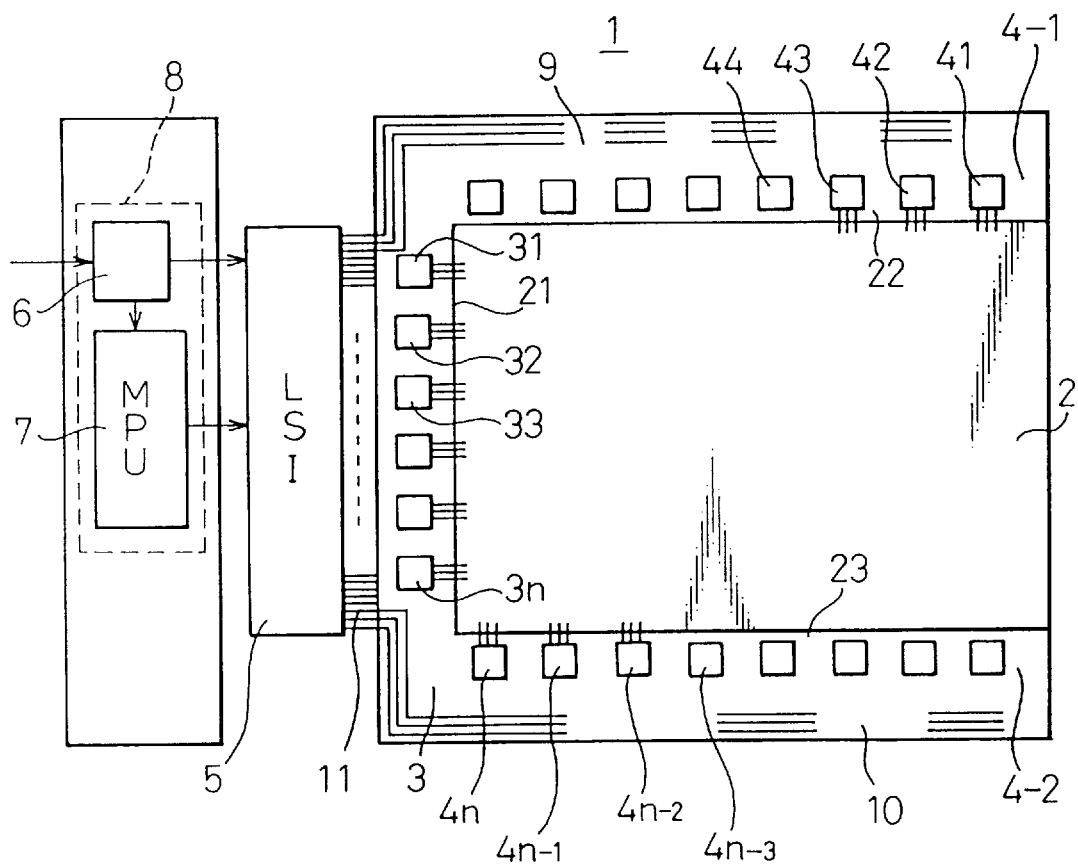
FIG. 4 is a plan view illustrating an example of constitution of a liquid crystal display apparatus of a prior art.

As described above and shown in FIG. 2, it is preferable, under the condition that the control circuit substrate 5 and the drive circuit substrate 3 are folded and stacked at the lower area of the rear surface of the liquid crystal display panel 2, that the second flexible wiring portions 61, 62 connected to the second drive circuit substrates 4-1, 4-2 are curved or folded as shown in FIG. 3 to turn into the lower area of the rear surface of the liquid crystal display panel 2 so that the connector inserting means 63, 64 provided at one end of each of the second flexible wiring portions 61, 62 can be individually engaged for the connection purpose with the input or output connector means 51, 52 for the control circuit signal of the second drive circuit substrates 4-1, 4-2 provided on the control circuit substrate 5 described above.

Employment of such a constitution enables elimination of at least the space region corresponding to the second flexible connection wiring portions 61, 62 at the upper and lower edge portions of the liquid crystal display panel 2, resulting in a contribution to a size reduction of the liquid crystal display apparatus 1.

Owing to the technique and constitution described above, the liquid crystal display apparatus 1 of the present invention has realized arrangement of the drive circuit substrate located at the lower part of the rear surface of the liquid crystal display panel while the drive circuit substrate is set in the folded condition. Thereby, the space region previously occupied by at least a part of the drive circuit substrate arranged in the periphery of the liquid crystal display panel of the liquid crystal display apparatus can be eliminated or saved and the area of the peripheral circuit of the liquid crystal display panel can be reduced as much as such area saving and a total size of the liquid crystal display apparatus can be reduced, while keeping the necessary size of the liquid crystal display panel.

Moreover, the present invention can provide a liquid crystal display apparatus which has overcome the problems, even when the size thereof is reduced, that the short-circuit or breaking of wires between the input and output terminals is increased or electrode resistance becomes high because some allowance is given in the gap between the adjacent input and output terminals. Moreover, the manufacturing cost thereof is reduced by improving the yield in mounting the drive circuits on a substrate for control circuits and that for the common electrode drive circuit.

Namely, in the present invention, since the control circuit substrate 5 and the drive circuit substrates 3 are fabricated separately from each other and accordingly when the display panel 2 is manufactured, a correctly formed control circuit substrate 5 and a correctly formed drive circuit substrate 3 are selectively combined with each other to form the final product of the display panel 2.

Therefore, in the present invention, the yield of the liquid crystal display panel 2 can be improved.

Hereinafter, the second to seventh embodiments of a liquid crystal display apparatus of the present invention will be explained in detail. However, each embodiment explained as the second to seventh embodiments of the present invention is the modification of the first embodiment of the present invention explained in FIGS. 1 to 3, and the basic constitution thereof is the same as that of the first embodiment.

Accordingly, the same constituent portions in each embodiment corresponding to those of the first embodiment of the present invention are denoted by the same reference numerals and the explanation thereof is omitted. Namely, in the second to seventh embodiments, only the different constitutions from the first embodiment will be explained to prevent redundancy in the specification.

Figure 5B:
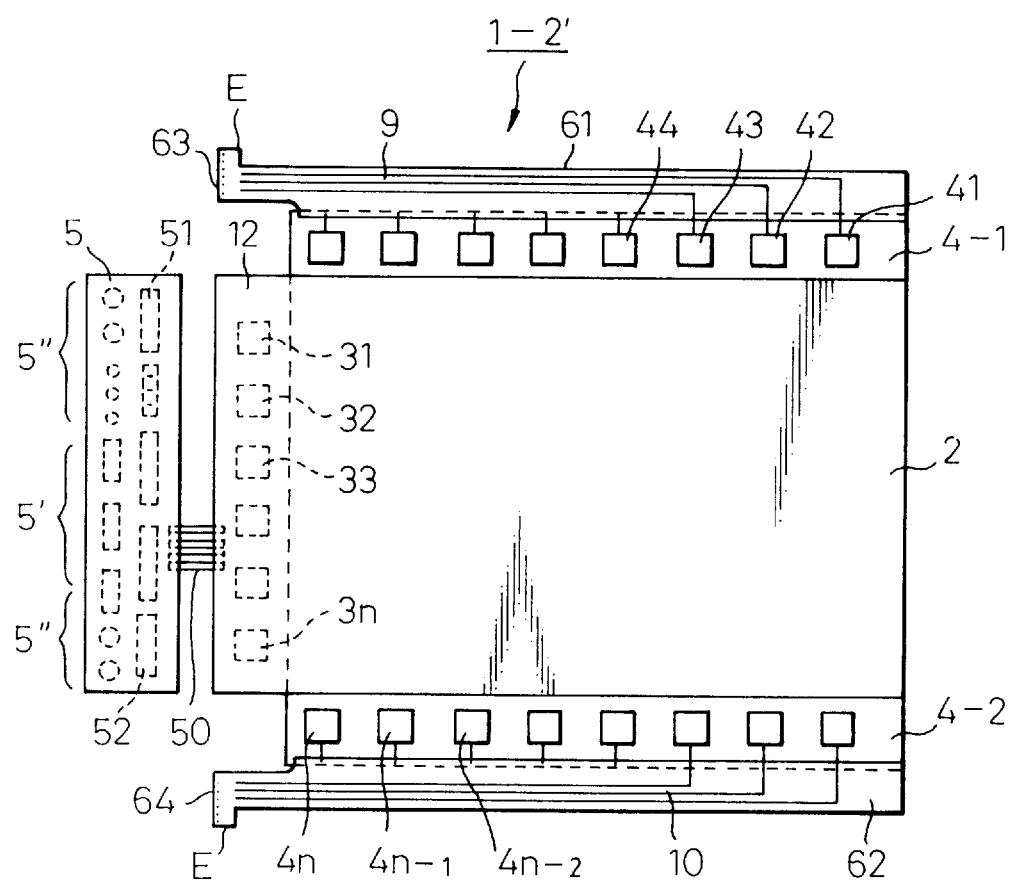
FIG. 5B is a top view of the modified second embodiment of a liquid crystal display apparatus of the present invention.
Figure 6:
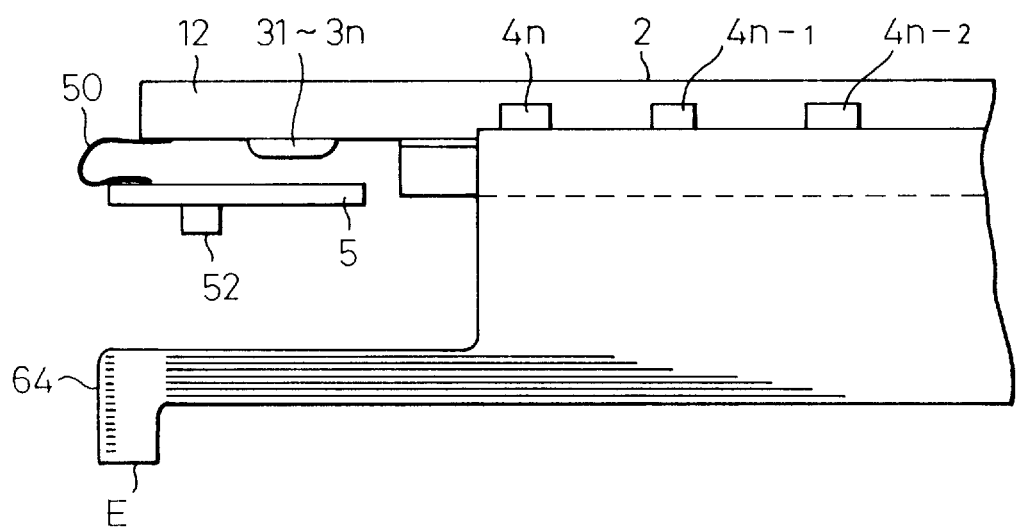
FIG. 6 is a side elevation view illustrating a constitution of the second embodiment of the liquid crystal display apparatus of the present invention.

FIG. 5A and 5B are top views illustrating a constitution of a second embodiment of a liquid crystal display apparatus 1-2 and 1-2' of the present invention, and FIG. 6 is a partial side elevation view of the liquid crystal display apparatus 1-2 shown in FIG. 5A.

In the second embodiment of the present invention, the liquid crystal display panel 2 has an extended glass panel portion 12 at one side thereof, and a plurality of panel drive ICs 31-3n are mounted on the extended glass panel portion 12 by a COG mounting technology. The panel drive ICs 31-3n for driving and controlling the common electrodes (Y electrodes) are connected to the liquid crystal display panel via circuit patterns (not shown) provided on the glass without using the first flexible connection wiring portion 30 in FIG. 1.

Accordingly, the common electrode drive circuit substrate 3 in FIG. 1 is not necessary in the second embodiment of the present invention. The third flexible connection wiring portion 50 is provided to connect between the extended glass panel portion 12 and the control circuit substrate 5.

The difference between the liquid crystal display apparatus 1-2 and 1-2' in FIGS. 5A and 5B is the arrangement of the circuit components including the connector means 51 and 52 mounted on the control circuit substrate 5. The circuit components are mounted on the top surface of the control circuit substrate 5 in FIG. 5A and are mounted on the rear surface of the control circuit substrate 5 in FIG. 5B.

In the second embodiment, it is possible to decrease the size and the cost of the liquid crystal display apparatus 1-2, since the common electrode drive circuit substrate 3 and the first flexible connection wiring portion 30 are not necessary and the connecting work between them is not necessary.

Before describing the third to seventh embodiments of the present invention, new composite wiring systems are explained by using FIGS. 7A to 8B.

Figure 7A:
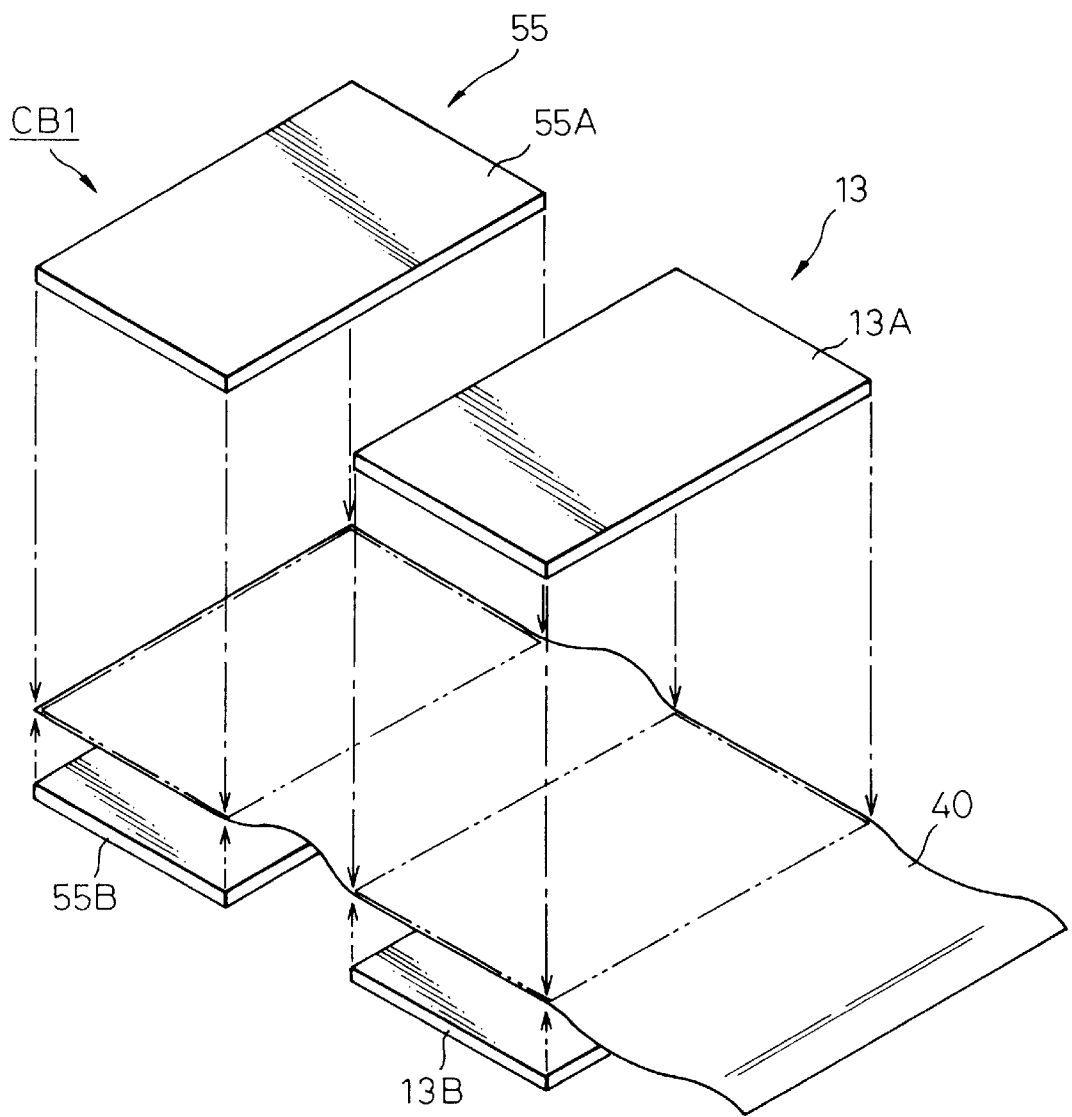
FIG. 7A is an exploded perspective view illustrating a constitution of a composite print circuit board made of a flexible print circuit board and rigid print circuit boards used for the liquid crystal display apparatus of the present invention.
Figure 7B:
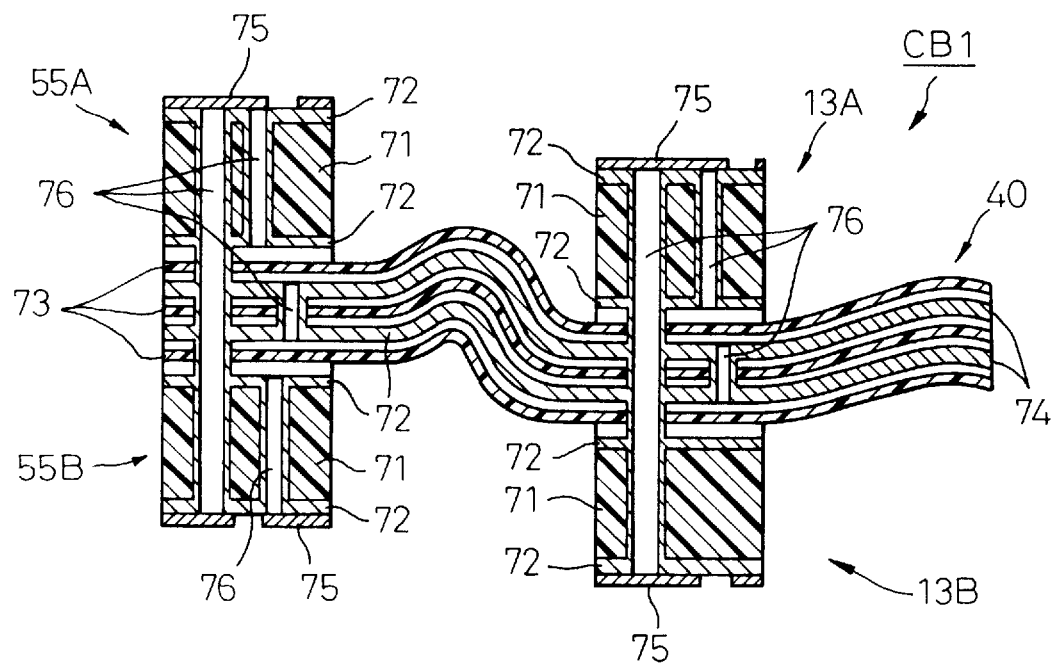
FIG. 7B is a sectional side elevation view illustrating a constitution of the composite print circuit board shown in FIG. 7A.

FIGS. 7A and 7B show a first composite wiring system using rigid print circuit boards 13A, 13B, 55A, and 55B, and a flexible print circuit board 40. As shown in FIG. 7A, the flexible print circuit board 40 is sandwiched by two pairs of rigid print circuit boards 13A and 13B, and 55A and 55B at two different portions to make a composite print circuit board CB1.

As shown in FIG. 7B, each of the rigid print circuit boards 13A, 13B, 55A, and 55B is made of a base substrate 71 having conductive patterns 72 on both sides thereof. The flexible print circuit board 40 is made of three film layers 73 and conductive patterns 74 are formed between the adjacent film layers 73. Blank layers without reference numerals show adhesive layers and a soldering resist 75 is formed on the outer face of the rigid print circuit boards 13A, 13B, 55A, and 55B. Further, the conductive patterns 72, 74 are electrically connected by a through-hole 76 at the predetermined same portions in the thickness direction of the composite print circuit board CB1.

Figure 8A:
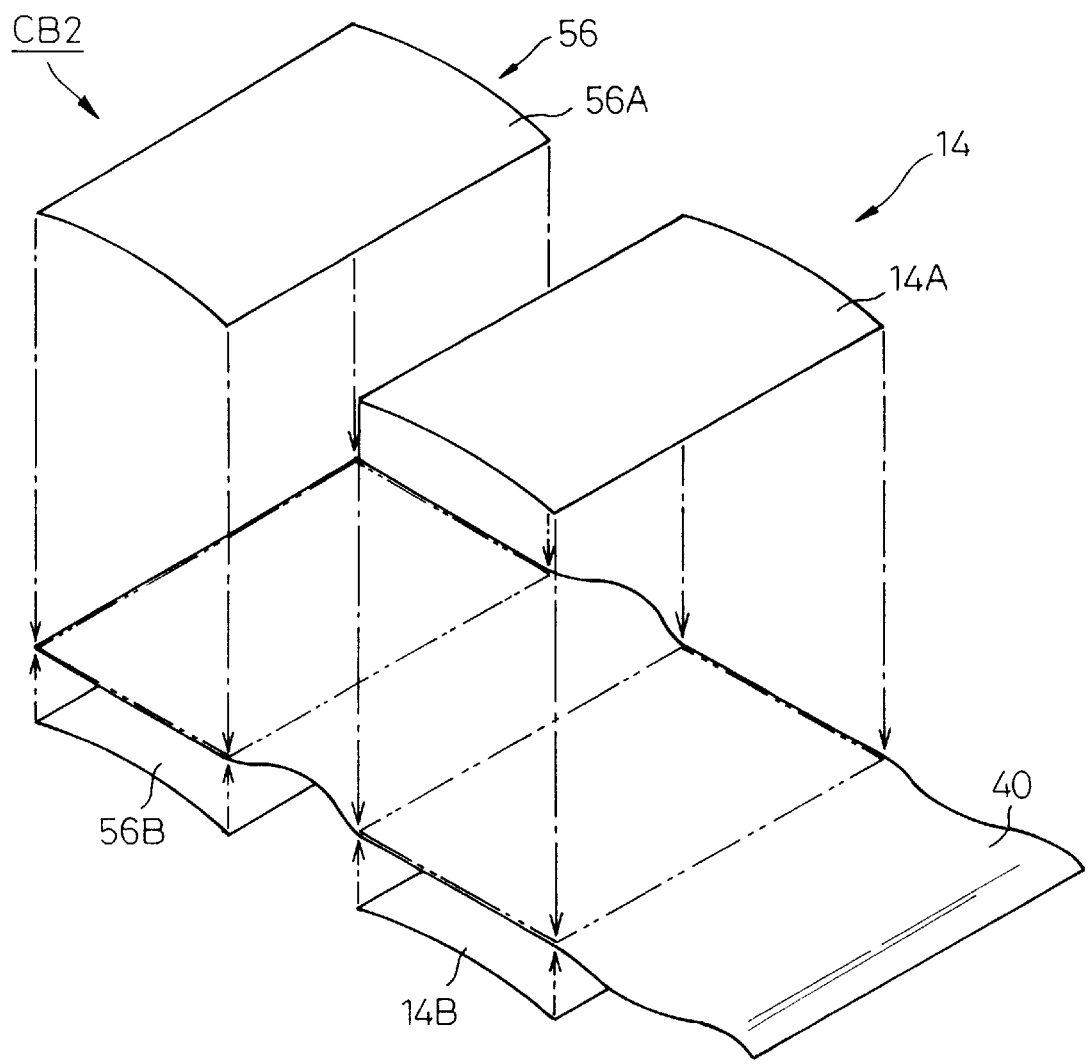
FIG. 8A is an exploded perspective view illustrating a constitution of a composite print circuit board made of flexible print circuit boards used for the liquid crystal display apparatus of the present invention.
Figure 8B:
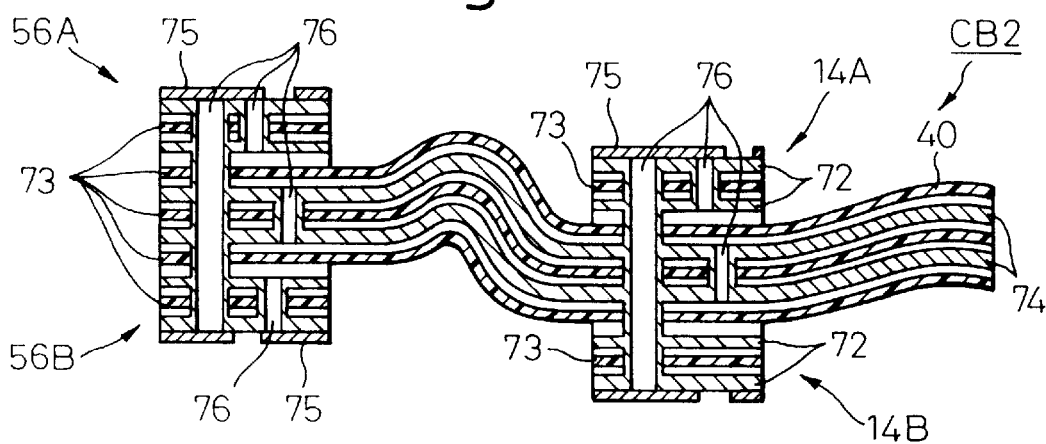
FIG. 8B is a sectional side elevation view illustrating a constitution of the composite print circuit board shown in FIG. 8A.

FIGS. 8A and 8B show a second composite wiring system using flexible print circuit boards 14A, 14B, 40, 56A, and 56B. As shown in FIG. 8A, the flexible print circuit board 40 is sandwiched by two pairs of flexible print circuit boards 14A and 14B, and 56A and 56B at two different portions to make a composite print circuit board CB2.

As shown in FIG. 8B, the constitution of the flexible print circuit boards 14A, 14B, 56A, and 56B are the same as that of the flexible print circuit board 40. A soldering resist 75 is formed on the outer face of the flexible print circuit boards 14A, 14B, 56A, and 56B. The plurality of the conductive patterns 72 are electrically connected by through-holes 76 at the predetermined same portions in the thickness direction of the composite print circuit board CB2.

Figure 10A:
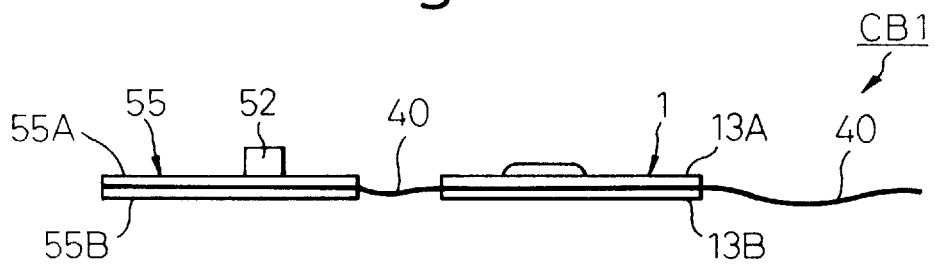
FIG. 10A is a side elevation view illustrating the composite print circuit board used for the third embodiment of a liquid crystal display apparatus of the present invention.
Figure 10B:
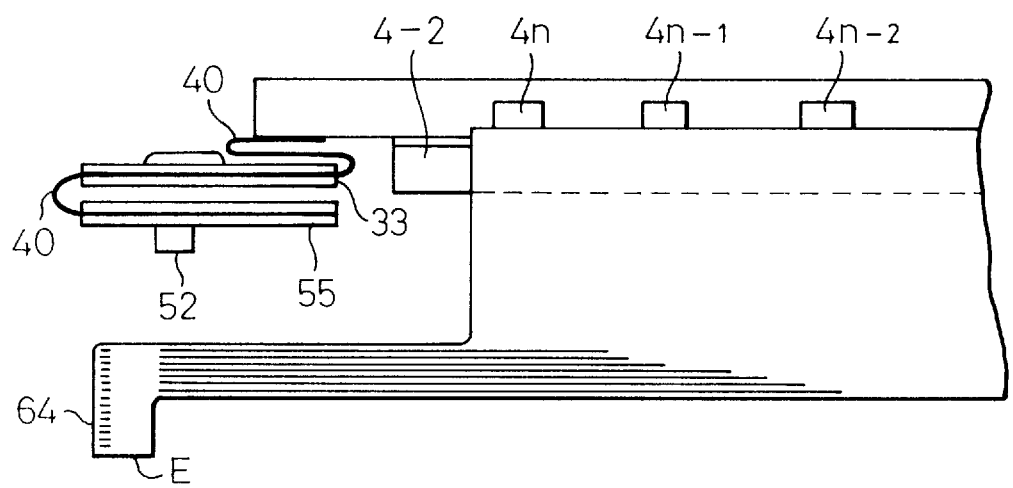
FIG. 10B is a side elevation view illustrating a constitution of the third embodiment of the liquid crystal display apparatus of the present invention.

FIG. 9 is a top view illustrating a constitution of a third embodiment of a liquid crystal display apparatus 1-3 of the present invention, and FIG. 10A is a side elevation view of the composite print circuit board CB1 or CB2 used for the liquid crystal display apparatus 1-3 shown in FIG. 9. FIG. 10B is a partial side elevation view of the liquid crystal display apparatus 1-3 and FIG. 10C is a partial perspective view of the liquid crystal display apparatus 1-3 shown in FIG. 9.

In the third embodiment, either one of the composite print circuit boards CB1 or CB2 can be used for the liquid crystal display apparatus 1-3. However, the explanation here will be given only for the liquid crystal display apparatus 1-3 having the composite print circuit board CB1.

In the third embodiment, the composite print circuit board CB1 as shown in FIG. 10A is used instead of using the common electrode drive circuit substrate 3, the control circuit substrate 5, the first flexible connection wiring portion 30, and the third flexible connection wiring portion 50 as shown in FIG. 1. Namely, a first drive circuit substrate 13 comprised of two rigid print circuit boards 13A and 13B is used instead of the first drive circuit substrate 3, the control circuit substrate 55 comprised of two rigid print circuit boards 55A and 55B is used instead of the control circuit substrate 5, and the flexible print circuit board 40 is used instead of the first flexible connection wiring portion 30 and the third flexible connection wiring portion 50.

Figure 10C:
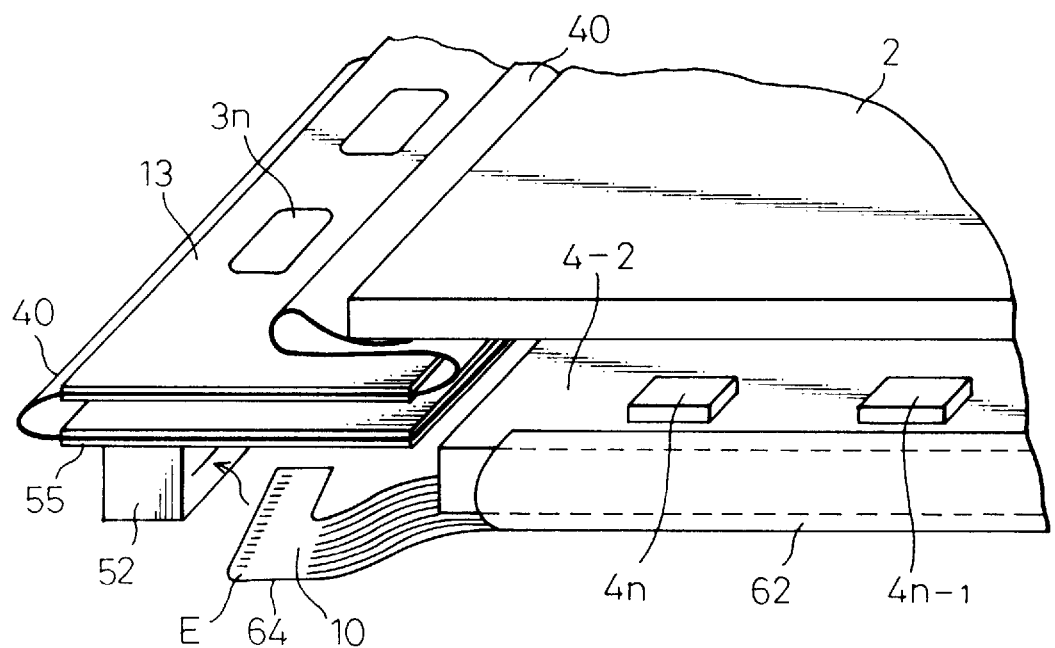
FIG. 10C is a perspective view illustrating a constitution of the third embodiment of the liquid crystal display apparatus of the present invention.

FIGS. 10B and 10C show the folding condition of the flexible print circuit board 40 and the stacking condition of the first drive circuit substrate 13 and the control circuit substrate 55. In the third embodiment, it is possible to decrease the assembling time of the liquid crystal display apparatus 1-3, since the connecting operation of the first flexible connection wiring portion 30 to the first drive circuit substrate 3 and the connecting operation of the third flexible connection wiring portion 50 to the first drive circuit substrate 3 and the control circuit substrate 5 are omitted.

FIGS. 11A to 12B show the fourth embodiment of the liquid crystal display apparatus 1-4 according to the present invention. In the fourth embodiment, a multiple second flexible connection wiring portion 61M and 62M made of a plurality of flexible print circuit boards are used.

Figure 11A:
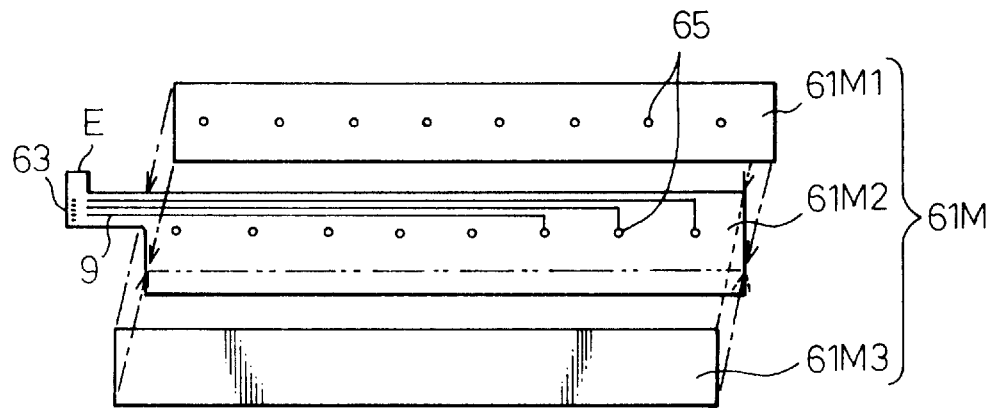
FIG. 11A is an exploded perspective view illustrating a constitution of a composite print circuit used for the fourth embodiment of the liquid crystal display apparatus of the present invention.

The constitution of the multiple second flexible connection wiring portion 61M is shown in FIG. 11A. The multiple second flexible connection wiring portion 61M has the same constitution as the composite print circuit board CB2 explained in FIGS. 8A and 8B. The second flexible connection wiring portion 61M is made of an upper, a middle, and a lower flexible print circuit boards 61M1, 61M2, and 61M3. Main portion of the middle flexible print circuit board 61M2 is sandwiched by the upper flexible print circuit board 61M1 and the lower flexible print circuit board 61M3. Connection wirings 9 are formed on the middle flexible print circuit board 61M2 and a plurality of through-holes 65 are provided at the same location of the upper and the middle flexible print circuit boards 61M1 and 61M2.

Figure 11B:
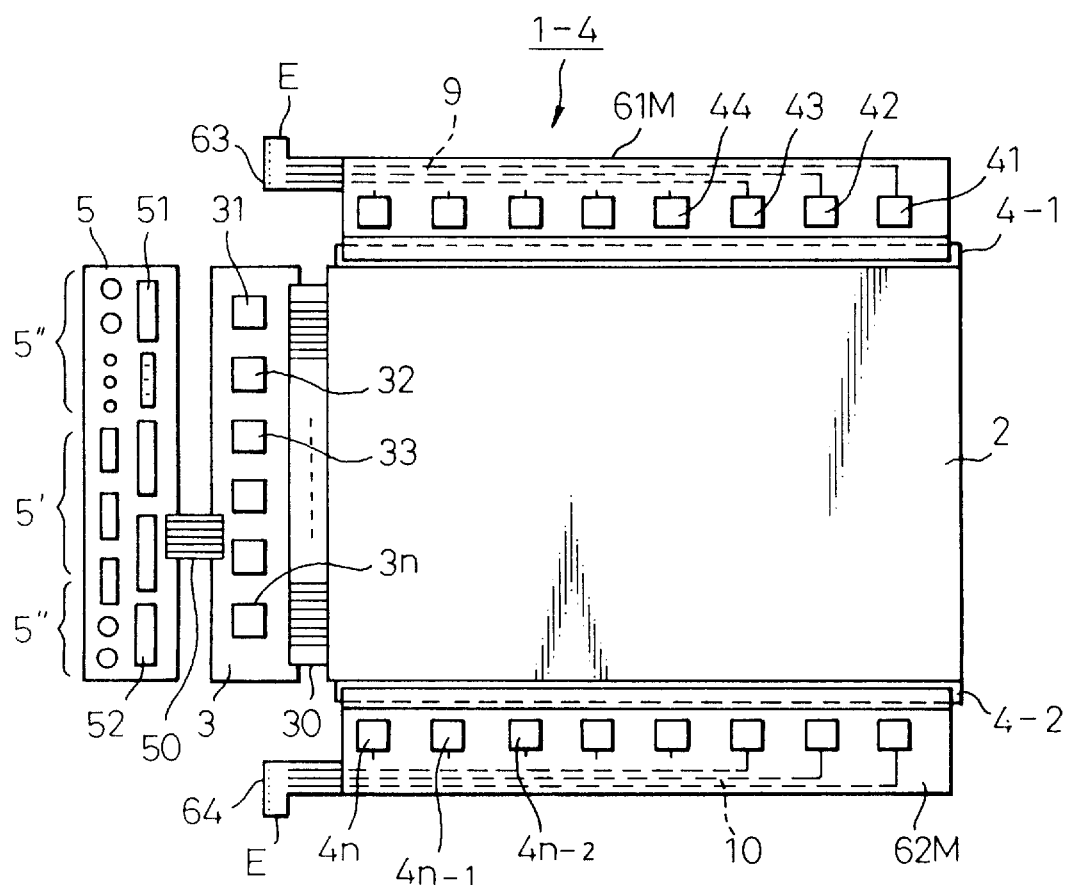
FIG. 11B is a top view illustrating a constitution of a fourth embodiment of a liquid crystal display apparatus of the present invention.
Figure 12A:
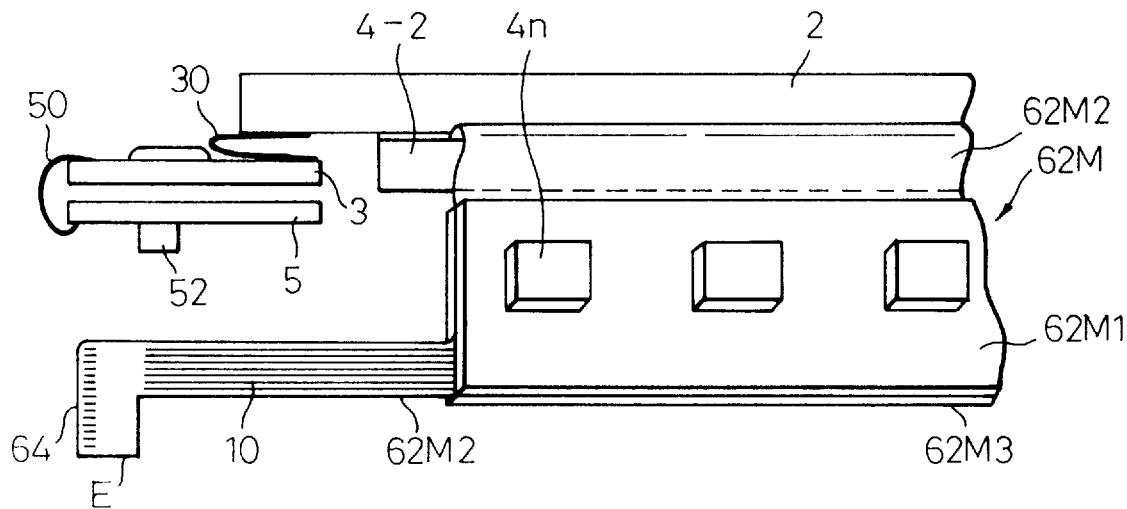
FIG. 12A is a side elevation view illustrating a constitution of the fourth embodiment of the liquid crystal display apparatus of the present invention.
Figure 12B:
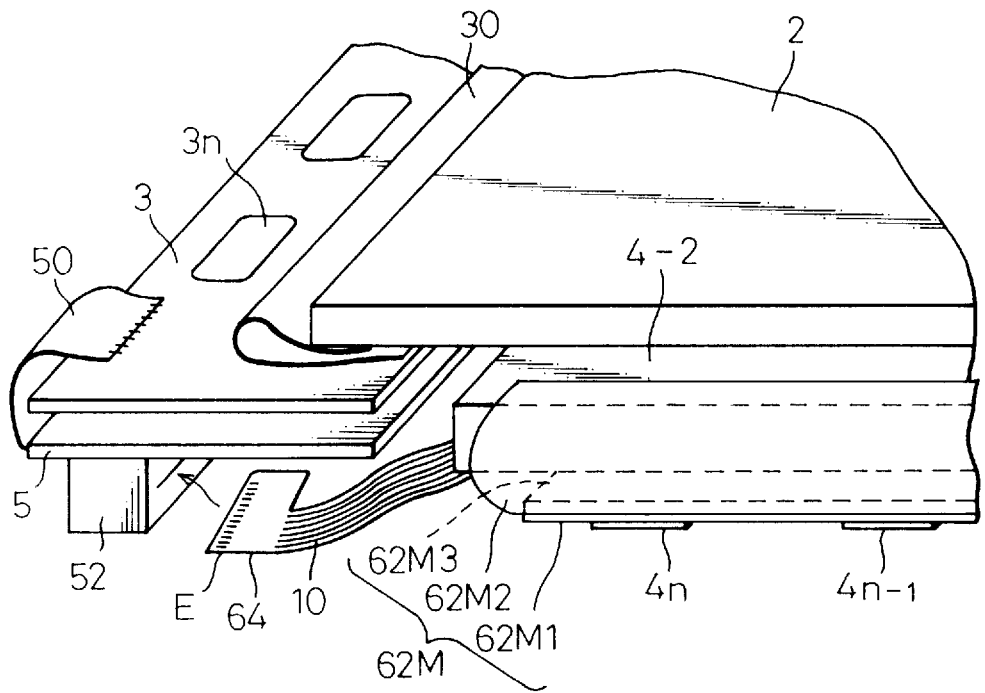
FIG. 12B is a perspective view illustrating a constitution of the fourth embodiment of the liquid crystal display apparatus of the present invention.

Since the main portion of the middle flexible print circuit board 61M1 is reinforced by the sandwich structure of the flexible print circuit boards 61M1 to 61M3, it is possible to mount the panel drive ICs 41-4*n* on the main portion thereof as shown in FIG. 11B. FIGS. 12A and 12B show the folding condition of the multiple second flexible connection wiring portion 62M on which the panel drive ICs 41-4*n* are mounted.

When the panel drive ICs 41-4*n* can be mounted on the main portion of the multiple second flexible connection wiring portion 61M, the extended length of the second drive circuit substrates 4-1 and 4-2 from the liquid crystal display panel 2 can be shortened as shown in FIG. 11B. As a result, the distance between the second drive circuit substrates 4-1 and 4-2 becomes shorter and it is possible to minimize the size of the liquid crystal display apparatus 1-4.

In the fourth embodiment, rigid print circuit boards can be also used instead of the upper and the lower flexible print circuit boards 61M1 and 61M3. Namely, the multiple second flexible connection wiring portions 61M and 62M may have the same constitution as the composite print circuit board CB1 explained in FIGS. 7A and 7B.

Figure 13:
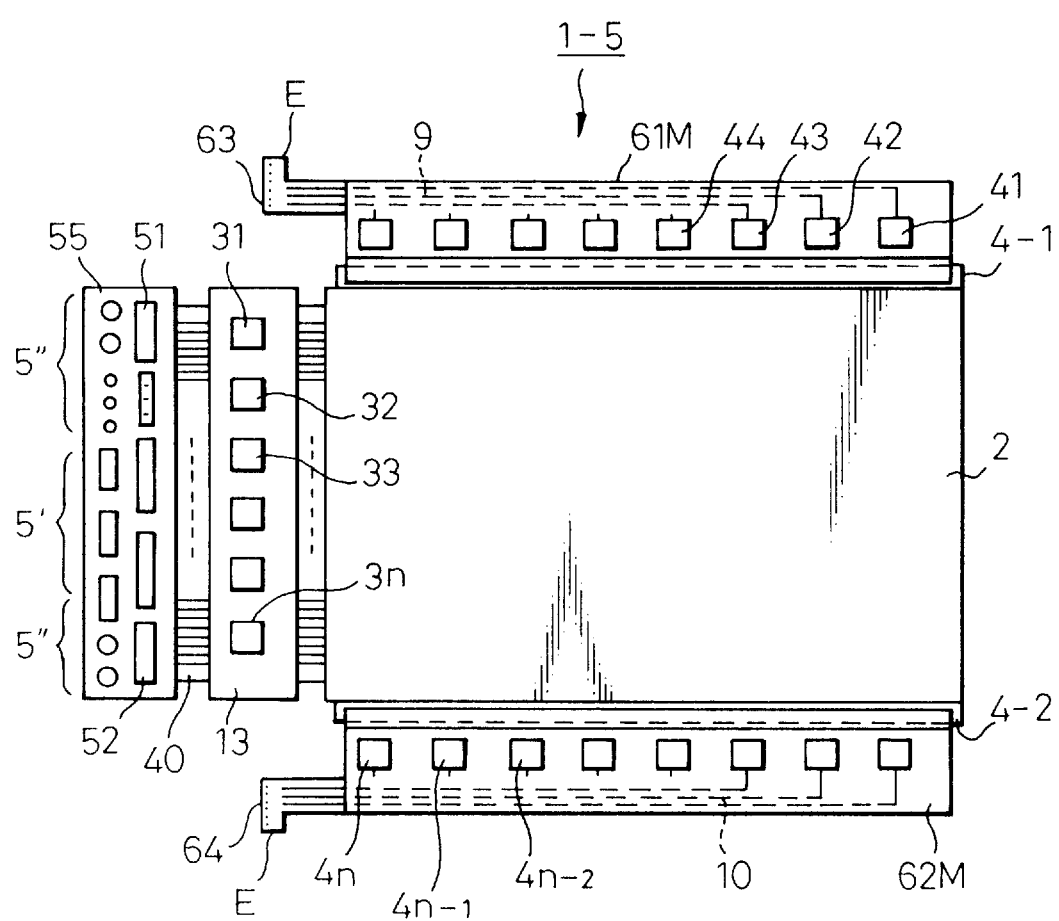
FIG. 13 is a top view illustrating a constitution of a fifth embodiment of a liquid crystal display apparatus of the present invention.
Figure 14A:
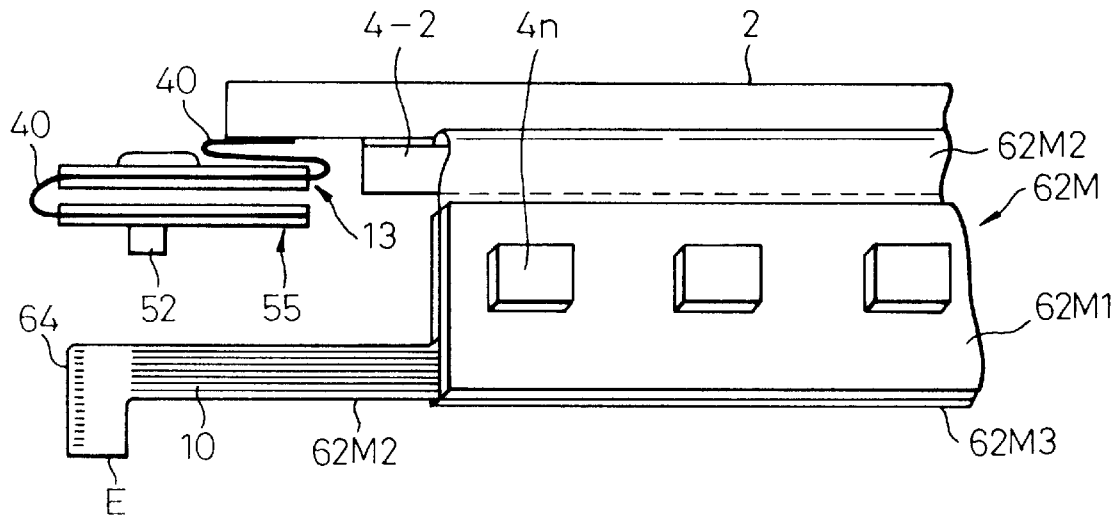
FIG. 14A is a side elevation view illustrating a constitution of the fifth embodiment of the liquid crystal display apparatus of the present invention.
Figure 14B:
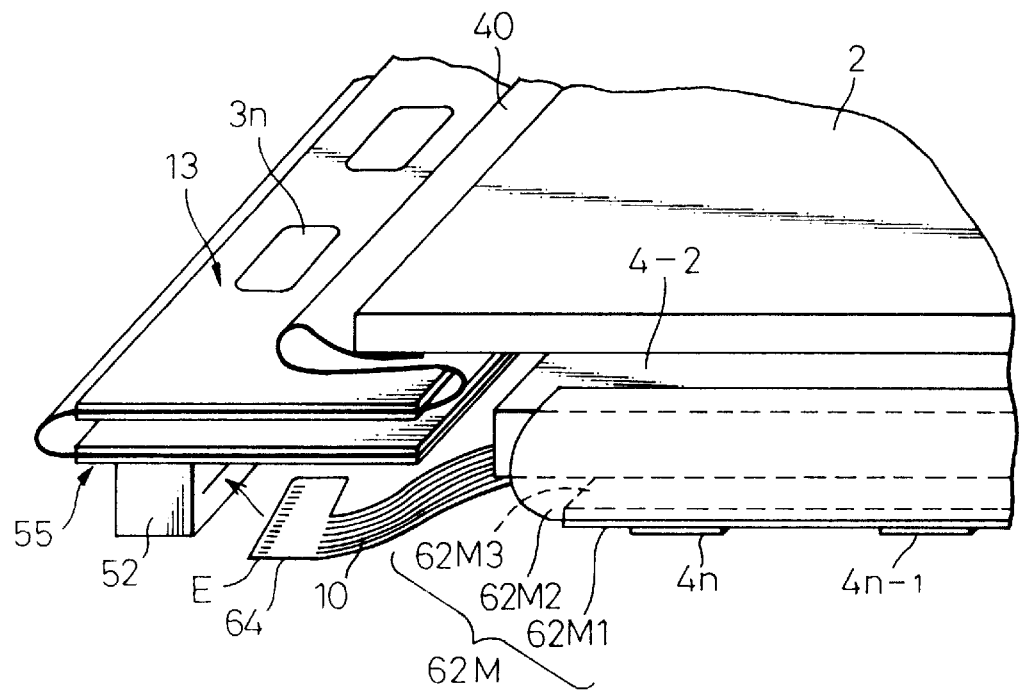
FIG. 14B is a perspective view illustrating a constitution of the fifth embodiment of the liquid crystal display apparatus of the present invention.

FIGS. 13 to 14B show the fifth embodiment of the liquid crystal display apparatus 1-5 according to the present invention. The fifth embodiment is the combination of the third embodiment and the fourth embodiment. Namely, in the fifth embodiment, the liquid crystal display apparatus 1-5 is equipped with the composite print circuit board CB1 (or CB2) comprised of the first drive circuit substrate 13 (or 14), the control circuit substrate 55 (or 56), and the flexible print circuit board 40 of the third embodiment, and the multiple second flexible connection wiring portion 61M and 62M of the fourth embodiment.

FIGS. 14A and 14B show the folding condition of the flexible print circuit board 40 and the stacking condition of the first drive circuit substrate 13 and the control circuit substrate 55, and the folding condition of the multiple second flexible connection wiring portion 62M.

The liquid crystal display apparatus 1-5 according to the fifth embodiment of the present invention has the merits of both the third and the fourth embodiment.

Figure 15A:
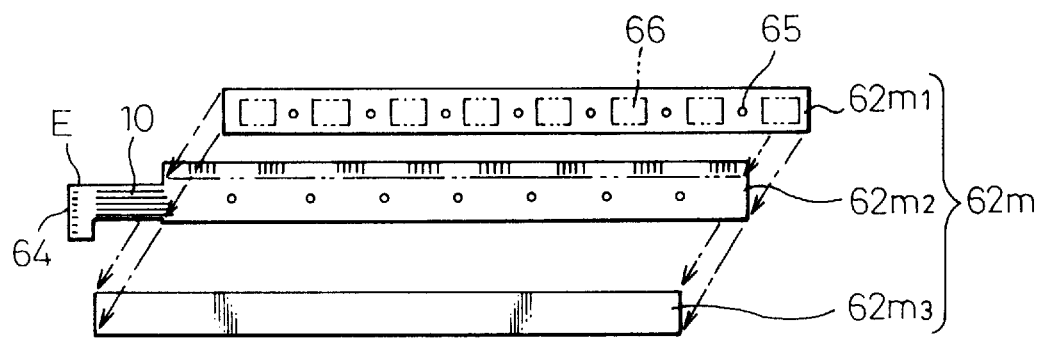
FIG. 15A is an exploded perspective view illustrating a constitution of a composite print circuit used for the sixth embodiment of the liquid crystal display apparatus of the present invention.
Figure 15B:
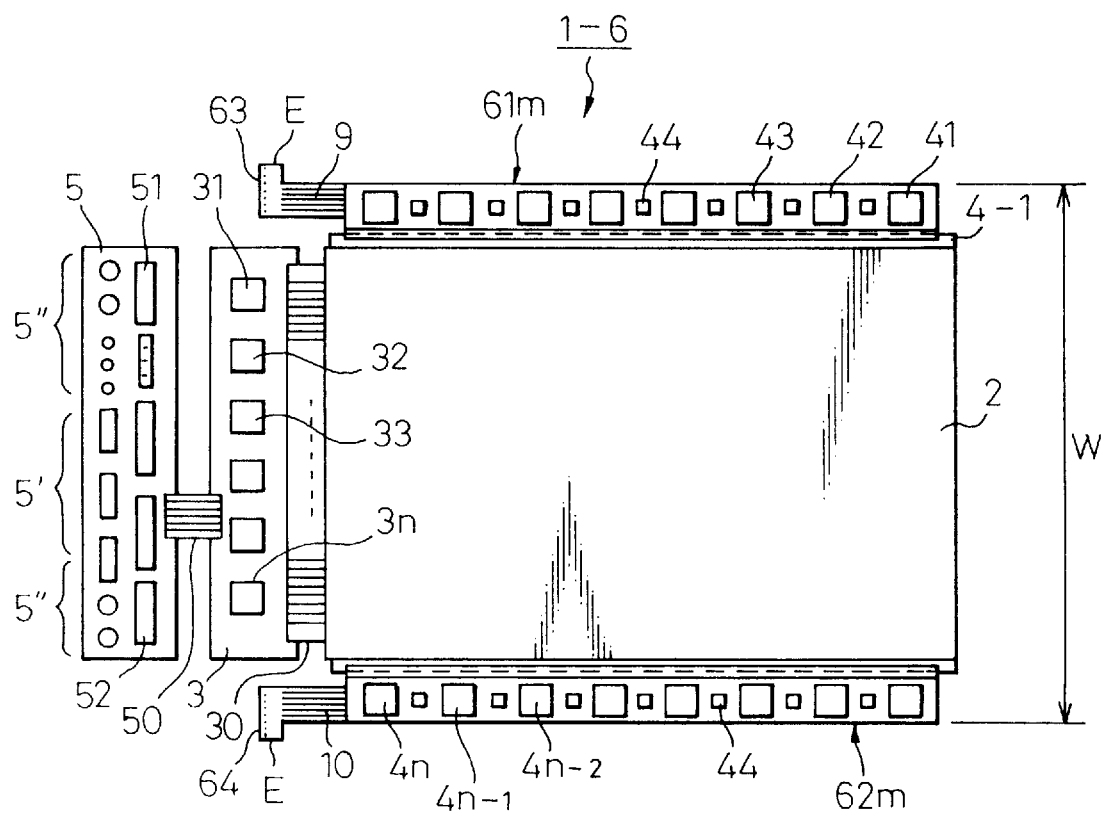
FIG. 15B is a top view illustrating a constitution of a sixth embodiment of a liquid crystal display apparatus of the present invention.
Figure 16:
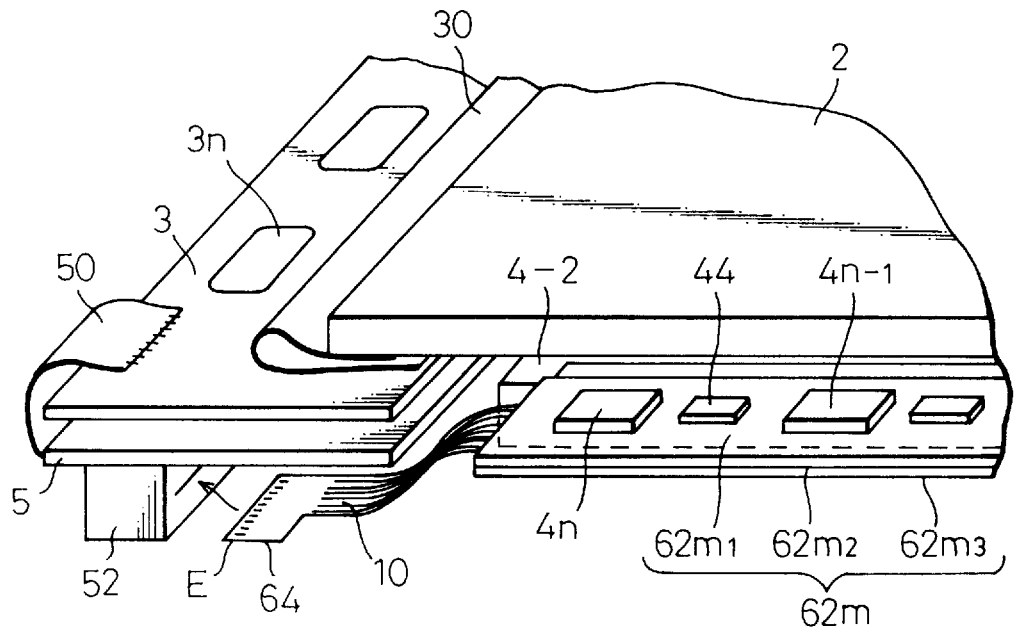
FIG. 16 is a perspective view illustrating a constitution of the sixth embodiment of the liquid crystal display apparatus of the present invention.

FIGS. 15A to 16 show the sixth embodiment of the liquid crystal display apparatus 1-6 according to the present invention. In the sixth embodiment, a multiple second flexible connection wiring portion 61*m* and 62*m* are used.

The constitution of the multiple second flexible connection wiring portion 62*m* is shown in FIG. 15A. The multiple second flexible connection wiring portion 62*m* has the same constitution as the composite print circuit board CB2 explained in FIGS. 8A and 8B. The multiple second flexible connection wiring portion 62*m* is made of an upper, a middle, and a lower flexible print circuit boards 61*m*1, 61*m*2, and 61*m*3. Main portion of the middle flexible print circuit board 62*m*2 is sandwiched by the upper flexible print circuit board 62*m*1 and the lower flexible print circuit board 62*m*3.

Connection wirings 10 are formed on the middle flexible print circuit board 62*m*2. A plurality of through-holes 65 for mounting chip elements and a plurality of IC-mounting-areas 66 having a plurality of through-holes are provided at the same location of the upper and the middle flexible print circuit boards 62*m*1 and 62*m*2. In the sixth embodiment, the IC-mounting areas 66 are formed on the upper flexible print circuit board 62*m*1.

FIG. 16 shows the folding condition of the flexible connection wiring portions 30 and 50 and the stacking condition of the first drive circuit substrate 3 and the control circuit substrate 5, and the folding condition of the multiple second flexible connection wiring portion 62*m*.

In the sixth embodiment, not only the panel drive ICs 41-4*n* but also chip elements 44 such as chip capacitors to remove the noise are mounted on the reinforced main portion of the multiple second flexible connection wiring portion 62*m*, it is possible to further minimize the noise in the liquid crystal display apparatus 1-6.

In the sixth embodiment, rigid print circuit boards can be also used instead of the upper and the lower flexible print circuit boards 61*m*1 and 61*m*3. Namely, the multiple second flexible connection wiring portions 61*m* and 62*m* may have the same constitution as the composite print circuit board CB1 explained in FIGS. 7A and 7B.

Figure 17:
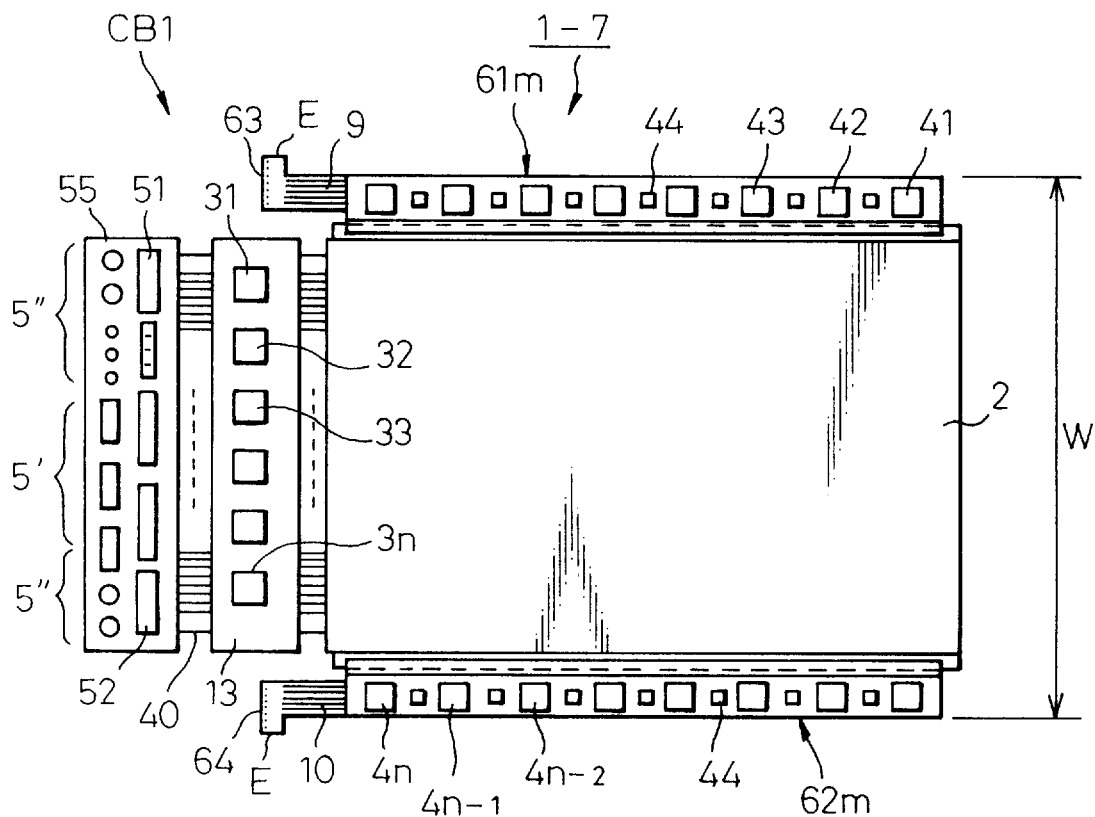
FIG. 17 is a top view illustrating a constitution of a seventh embodiment of a liquid crystal display apparatus of the present invention.
Figure 18:
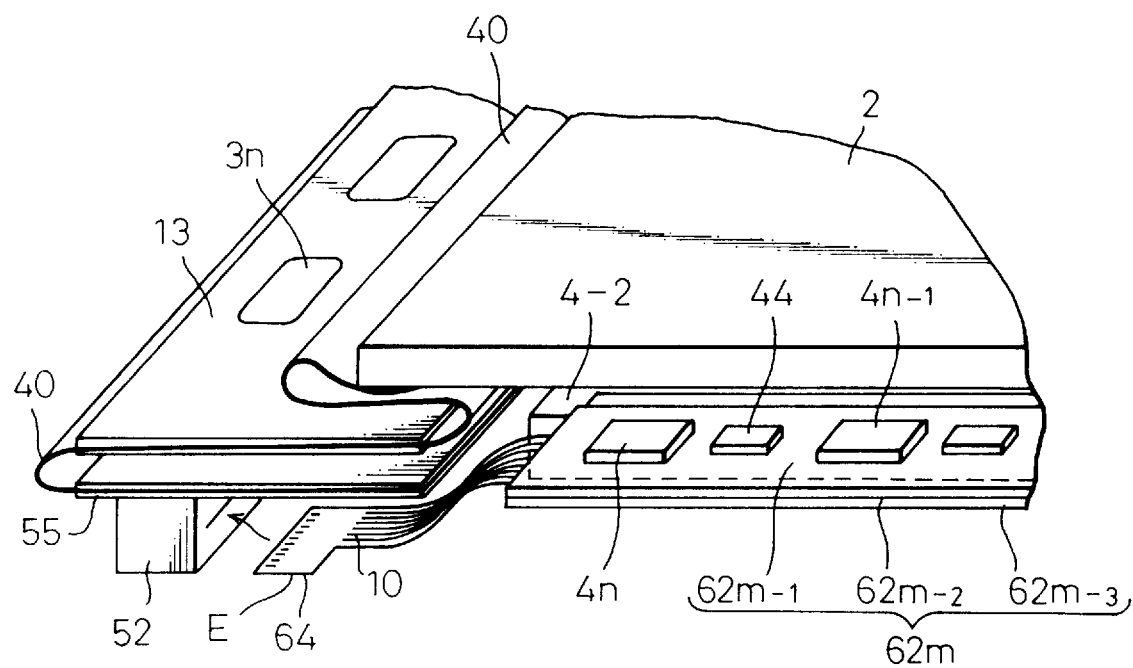
FIG. 18 is a perspective view illustrating a constitution of the seventh embodiment of the liquid crystal display apparatus of the present invention.

FIGS. 17 and 18 show the seventh embodiment of the liquid crystal display apparatus 1-7 according to the present invention. In the seventh embodiment, the composite print circuit board CB1 comprised of the first drive circuit substrate 13, the control circuit substrate 55, and the flexible print circuit board 40 is used in addition to the multiple second flexible connection wiring portion 61m and 62m used in the sixth embodiment.

The constitution of the composite print circuit board CB1 is the same as explained in the former embodiments. The composite print circuit board CB2 explained in FIGS. 8A and 8B can be also used instead of the composite print circuit board CB1.

FIG. 18 shows the folding condition of the flexible print circuit board 40 and the stacking condition of the first drive circuit substrate 13 and the control circuit substrate 55, and the folding condition of the multiple second flexible connection wiring portion 62m.

In the seventh embodiment, it is possible to further minimize the size of the liquid crystal display apparatus 1-7, and to shorten the assembling process of the same as compared with that of the sixth embodiment.

FIG. 19 shows the eighth embodiment of the liquid crystal display apparatus 1-8 according to the present invention. In the eighth embodiment, single multilayered flexible board is used as the second flexible connection wiring portion 61 and 62, and the panel drive ICs 41 to 4n are mounted thereon. The other constitutions are the same as the second embodiment as shown in FIG. 5A.

What is claimed is:

1. A liquid crystal display apparatus comprising:
   a liquid crystal display panel;
   common electrode drive IC groups and segment electrode drive IC groups arranged on the periphery of said liquid crystal display panel to drive said panel;
   a control circuit substrate having a connector means for individually driving and controlling said common electrode drive IC groups and segment electrode drive IC groups;
   a first connection portion for electrically connecting said common electrode drive IC groups to common electrodes of said liquid crystal display panel;
   a second connection wiring portion made of a flexible cable having a connector insertion means for electrically connecting said segment electrode drive IC groups to said control circuit substrate by inserting said connector insertion means to said connector means on said control circuit substrate; and
   a third connection wiring portion for electrically connecting said control circuit substrate to said common electrode drive IC groups;
   said common electrode drive IC groups are provided on an extended glass portion of the glass substrate of said liquid crystal display panel by chip on glass mounting technology,
   said third connection wiring portion are made of a flexible cable, and
   said segment electrode drive IC groups are provided on an extended portion of another glass substrate of said liquid crystal display panel by chip on glass mounting technology.

2. A liquid crystal display apparatus according to claim 1, wherein
   said control circuit substrate is arranged at a position below said extended glass portion, and
   said second connection wiring portion is located at the position below the rear surface of said liquid crystal display panel.

3. A liquid crystal display apparatus comprising:
   a liquid crystal display panel;
   common electrode drive IC groups and segment electrode drive IC groups arranged on the periphery of said liquid crystal display panel to drive said panel;
   a control circuit substrate having a connector means for individually driving and controlling said common electrode drive IC groups and segment electrode drive IC groups;
   a first connection wiring portion for electrically connecting said common electrode drive IC groups to common electrodes of said liquid crystal display panel;
   a second connection wiring portion made of a flexible cable having a connector insertion means for electrically connecting said segment electrode drive IC groups to said control circuit substrate by inserting said connector insertion means to said connector means on said control circuit substrate; and
   a third connection wiring portion for electrically connecting said control circuit substrate to said common electrode drive IC groups;
   at least one of said common electrode drive IC groups and said segment electrode drive IC groups are mounted on a multiple-layered composite cable.

4. A liquid crystal display apparatus according to claim 3, wherein
   said common electrode drive IC groups, said control circuit substrate, said first connection wiring portion, and said third connection wiring portion are integrally formed as a multiple-layered composite cable,
   said multiple-layered composite cable is equipped with a flexible print circuit board sandwiched by two pairs of print circuit boards at two different portions,
   said flexible print circuit board serves as said first connection wiring portion and said third connection wiring portion,
   one pair of said print circuit boards serves as a first drive circuit substrate for mounting said common electrode drive IC groups,
   another pair of said print circuit boards serves as said control circuit substrate, and
   predetermined portions of said flexible print circuit board and each of said pairs of print circuit boards are electrically connected.

5. A liquid crystal display apparatus according to claim 4, wherein
   said first drive circuit substrate and said control circuit substrate are folded via said flexible print circuit board and stacked against each other and are then arranged at said position below the rear surface of said liquid crystal display panel, and
   said second connection wiring portion is located at the position below the rear surface of said liquid crystal display panel.

6. A liquid crystal display apparatus according to claim 3, wherein
   said segment electrode drive IC groups are mounted on a multiple-layered composite cable,
   said multiple-layered composite cable is made of an upper print circuit board, a middle flexible print circuit board and a lower print circuit board,
   main portion of said middle flexible print circuit board is sandwiched by said upper and lower print circuit board,
   said middle flexible print circuit board serves as said second connection wiring portion, and predetermined portions of said middle flexible print circuit board and each of said upper and lower print circuit board are electrically connected.

7. A liquid crystal display apparatus according to claim 6, wherein said first drive circuit substrate and said control circuit substrate are folded via said first connection wiring portion and said third connection wiring portion and stacked against each other and are then arranged at said position below the rear surface of said liquid crystal display panel, and said multiple-layered composite cable is located at the position below the rear surface of said liquid crystal display panel.

8. A liquid crystal display apparatus according to claim 4, wherein said segment electrode drive IC groups are mounted on a multiple-layered composite cable, said multiple-layered composite cable is made of an upper print circuit board, a middle flexible print circuit board and a lower print circuit board, the main portion of said middle flexible print circuit board is sandwiched by said upper and lower print circuit board, said middle flexible print circuit board serves as said second connection wiring portion, and predetermined portions of said middle flexible print circuit board and each of said upper and lower print circuit board are electrically connected.

9. A liquid crystal display apparatus according to claim 8, wherein said first drive circuit substrate and said control circuit substrate are folded via said flexible print circuit board and stacked against each other and are then arranged at said position below the rear surface of said liquid crystal display panel, and said multiple-layered composite cable is located at the position below the rear surface of said liquid crystal display panel.

10. A liquid crystal display apparatus according to claim 6, wherein at least one tip elements are mounted on said multiple-layered composite cable.

11. A liquid crystal display apparatus according to claim 10, wherein said first drive circuit substrate and said control circuit substrate are folded via said first connection wiring portion and said third connection wiring portion and stacked against each other and are then arranged at said position below the rear surface of said liquid crystal display panel, and said multiple-layered composite cable is located at the position below the rear surface of said liquid crystal display panel.

12. A liquid crystal display apparatus according to claim 8, wherein at least one tip elements are mounted on said multiple-layered composite cable.

13. A liquid crystal display apparatus according to claim 12, wherein said first drive circuit substrate and said control circuit substrate are folded via said flexible print circuit board and stacked against each other and are then arranged at said position below the rear surface of said liquid crystal display panel, and said multiple-layered composite cable is located at the position below the rear surface of said liquid crystal display panel.

14. A liquid crystal display apparatus comprising:

a liquid crystal display panel;

common electrode drive IC groups and segment electrode drive IC groups arranged on the periphery of said liquid crystal display panel to drive said panel;

a control circuit substrate having a connector means for individually driving and controlling said common electrode drive IC groups and segment electrode drive IC groups;

a first connection wiring portion for electrically connecting said common electrode drive IC groups to common electrodes of said liquid crystal display panel;

a second connection wiring portion made of a flexible cable having a connector insertion means for electrically connecting said segment electrode drive IC groups to said control circuit substrate by inserting said connector insertion means to said connector means on said control circuit substrate; and a third connection wiring portion for electrically connecting said control circuit substrate to said common electrode drive IC groups;

said segment electrode drive IC groups are mounted on a flexible cable.

\* \* \* \* \*